US007225399B2

(12) United States Patent
Watson

(10) Patent No.: US 7,225,399 B2
(45) Date of Patent: May 29, 2007

(54) SYSTEMS AND METHODS FOR GENERATING INTERACTIVE ELECTRONIC REFERENCE MATERIALS

(75) Inventor: Mike Watson, St. Louis, MO (US)

(73) Assignee: Engineered Support System, Inc., St. Louis, MO (US)

( * ) Notice: Subject to any disclaimer, the term of this patent is extended or adjusted under 35 U.S.C. 154(b) by 281 days.

(21) Appl. No.: 10/285,297

(22) Filed: Oct. 31, 2002

(65) Prior Publication Data

US 2003/0126129 A1 Jul. 3, 2003

Related U.S. Application Data

(60) Provisional application No. 60/336,192, filed on Oct. 31, 2001, provisional application No. 60/336,195, filed on Oct. 31, 2001, provisional application No. 60/336,204, filed on Oct. 31, 2001, provisional application No. 60/336,206, filed on Oct. 31, 2001.

(51) Int. Cl.
*G06N 3/00* (2006.01)

(52) U.S. Cl. .................................................... 715/513

(58) Field of Classification Search ............. 715/500.1, 715/513, 517, 523, 530
See application file for complete search history.

(56) References Cited

U.S. PATENT DOCUMENTS

| | | | | |
|---|---|---|---|---|
| 4,995,514 | A | 2/1991 | Forschner | |
| 5,247,437 | A | 9/1993 | Vale et al. | 707/1 |
| 5,550,746 | A | 8/1996 | Jacobs | |
| 5,708,825 | A | 1/1998 | Sotomayor | 715/501.1 |
| 5,794,236 | A | 8/1998 | Mehrle | 707/5 |
| 5,794,257 | A | 8/1998 | Liu et al. | 715/501.1 |
| 5,875,110 | A | 2/1999 | Jacobs | |
| 6,052,670 | A | 4/2000 | Johnson | 705/27 |
| 6,070,717 | A | 6/2000 | Philipson et al. | 206/45.28 |
| 6,134,557 | A | 10/2000 | Freeman | 707/102 |
| 6,138,129 | A * | 10/2000 | Combs | 707/6 |
| 6,295,542 | B1 | 9/2001 | Corbin | 715/501.1 |
| 6,353,770 | B1 | 3/2002 | Ramsey et al. | 700/131 |
| 6,516,240 | B2 | 2/2003 | Ramsey et al. | 700/131 |
| 6,611,725 | B1 * | 8/2003 | Harrison et al. | 700/98 |
| 6,898,605 | B2 | 5/2005 | Constantino | 707/101 |
| 2002/0026385 | A1 * | 2/2002 | McCloskey et al. | 705/27 |
| 2002/0059265 | A1 * | 5/2002 | Valorose, III | 707/100 |
| 2002/0103716 | A1 | 8/2002 | Wieland et al. | 705/26 |

(Continued)

OTHER PUBLICATIONS

"MIL-STD-3001." <http://navycals.dt.navy.mil/xml-sgm-rep/rep-dtd/mil-std-300/>.*

(Continued)

*Primary Examiner*—Stephen Hong
*Assistant Examiner*—Kyle Stork
(74) *Attorney, Agent, or Firm*—Lewis, Rice & Fingersh, L.C.

(57) ABSTRACT

Described herein, amongst other things, are electronically available interactive reference materials that can preferably be accessed by using a network, such as the World Wide Web or Internet, to eliminate the need to create and transport paper. There are further described systems, methods, and means for generating, storing, and providing to a user these interactive reference materials. There are also disclosed, system, methods, and means for generating, storing, and providing to a user interactive electronic systems for use with the interactive reference materials.

16 Claims, 25 Drawing Sheets

U.S. PATENT DOCUMENTS

| | | | | |
|---|---|---|---|---|
| 2002/0154114 | A1 | 10/2002 | Christensen et al. | 345/419 |
| 2002/0156692 | A1 | 10/2002 | Squeglia et al. | 705/26 |
| 2002/0156694 | A1 | 10/2002 | Christensen et al. | 705/26 |
| 2003/0004740 | A1 | 1/2003 | Dickey et al. | 705/1 |
| 2003/0028451 | A1 | 2/2003 | Ananian | 705/27 |

OTHER PUBLICATIONS

"Air Force Technical Manual Contract Requirements (TMCR) For Joint Interface Control Officer (JICO) Support System (JSS) Attachment 9."*

"Field Manual (FM)," <http://www.asrl.com/cnstruct/tradoc/fm4_abs.htm>.*

Mitchell 1 Helps Librarians with New Web-Based Automotive Repair Info (Jan. 8, 2002) http://www.mitchell1.com/n_new_2002a.asp.

Mitchell 1 Reinvents, Revolutionizes Popular OnDemand Repair and Estimating Information Systems (Jan. 8, 2002).

Mitchell 1 Introduces eAutorepair: Company's First Product Aimed at Do-It-Yourself Auto Repair Enthusiast (Nov. 12, 2004) http://www.mitchell1.com/n_new_2004.asp.

Printouts from Mitchell1 Website re: OnDemand Version 5.6 Software Enhancements http://www.mitchell1.com/products/ondemand5version5_6.asp (Printed Aug. 15, 2005).

Printouts from Mitchell1 Website re Mitchell's Scalable Vector Graphic (SVG) Color Wiring Diagrams (printed Aug. 15, 2005).

Introducing OnDemand5: Finish First (Compact Disc) (undated).

* cited by examiner

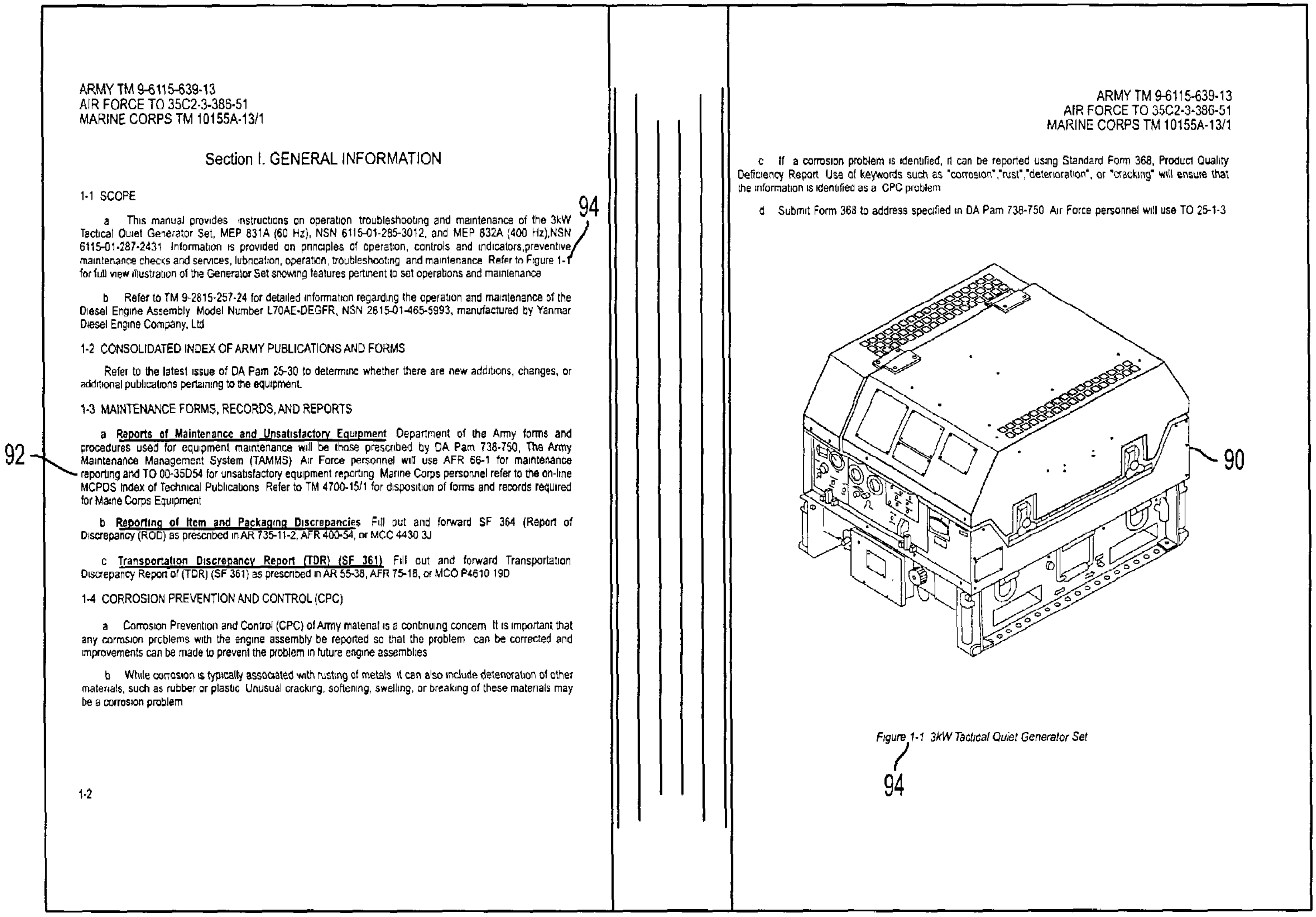

ARMY TM 9-6115-639-13
AIR FORCE TO 35C2-3-386-51
MARINE CORPS TM 10155A-13/1

Section I. GENERAL INFORMATION 1-1 SCOPE a This manual provides instructions on operation troubleshooting and maintenance of the 3kW Tactical Quiet Generator Set, MEP 831A (60 Hz), NSN 6115-01-285-3012, and MEP 832A (400 Hz),NSN 6115-01-287-2431 Information is provided on principles of operation, controls and indicators,preventive maintenance checks and services, lubrication, operation, troubleshooting and maintenance Refer to Figure 1-1 for full view illustration of the Generator Set showing features pertinent to set operations and maintenance b Refer to TM 9-2815-257-24 for detailed information regarding the operation and maintenance of the Diesel Engine Assembly Model Number L70AE-DEGFR, NSN 2815-01-465-5993, manufactured by Yanmar Diesel Engine Company, Ltd 1-2 CONSOLIDATED INDEX OF ARMY PUBLICATIONS AND FORMS Refer to the latest issue of DA Pam 25-30 to determine whether there are new additions, changes, or additional publications pertaining to the equipment.

1-3 MAINTENANCE FORMS, RECORDS, AND REPORTS a Reports of Maintenance and Unsatisfactory Equipment Department of the Army forms and procedures used for equipment maintenance will be those prescribed by DA Pam 738-750, The Army Maintenance Management System (TAMMS) Air Force personnel will use AFR 66-1 for maintenance reporting and TO 00-35D54 for unsatisfactory equipment reporting Marine Corps personnel refer to the on-line MCPDS Index of Technical Publications Refer to TM 4700-15/1 for disposition of forms and records required for Marine Corps Equipment b Reporting of Item and Packaging Discrepancies Fill out and forward SF 364 (Report of Discrepancy (ROD) as prescribed in AR 735-11-2, AFR 400-54, or MCC 4430 3J c Transportation Discrepancy Report (TDR) (SF 361) Fill out and forward Transportation Discrepancy Report of (TDR) (SF 361) as prescribed in AR 55-38, AFR 75-18, or MCO P4610 19D 1-4 CORROSION PREVENTION AND CONTROL (CPC)

a Corrosion Prevention and Control (CPC) of Army material is a continuing concern It is important that any corrosion problems with the engine assembly be reported so that the problem can be corrected and improvements can be made to prevent the problem in future engine assemblies b While corrosion is typically associated with rusting of metals it can also include deterioration of other materials, such as rubber or plastic Unusual cracking, softening, swelling, or breaking of these materials may be a corrosion problem 1-2

ARMY TM 9-6115-639-13
AIR FORCE TO 35C2-3-386-51
MARINE CORPS TM 10155A-13/1 c If a corrosion problem is identified, it can be reported using Standard Form 368, Product Quality Deficiency Report Use of keywords such as "corrosion","rust","deterioration", or "cracking" will ensure that the information is identified as a CPC problem d Submit Form 368 to address specified in DA Pam 738-750 Air Force personnel will use TO 25-1-3

Figure 1-1 3kW Tactical Quiet Generator Set

FIG. 2

```
indicator light or meter.
pumpage  The fluid being pumped by the fuel transfer pump.
Separator Element   A filter element that repels coalesced water droplets.
  The pumpage flows from the outside to the inside of the element.
###
Section II. EQUIPMENT DESCRIPTION

1.8 CHARACTERISTICS, CAPABILITIES AND FEATURES.  (Refer to #FR:Figure
1-1[*F001-01.gif].)
      a. Characteristics.
            (1) Four person portable.
            (2) Dry break unisex couplings(1).
      b. Capabilities
            (1) Provides filtered fuel by removing impurities and water
from fuel.
            (2) Maximum flow rate of 240 GPM.
      c. Features
            (1) Sight gauge (2).
            (2) Differential pressure gauge (3).
            (3) Sump (4).
            (4) Sampling port(5).
#FIGURE:Figure 1-1. Advanced Aviation Forward Area Refueling System (AAFARS)
Liquid Fuel Filter-Separator[*F001-01.gif]

1.9 LOCATION AND DESCRIPTION OF MAJOR COMPONENTS. (Refer to #FR:Figure
1-2[*F002-01.gif].)
The liquid fuel filter-separator is an aluminum vessel (1) with an integral
frame and is designed to house three coalescer elements (2) and a separator
element (3). A sump (4) at the bottom of the vessel (1) collects water and
sediment removed from the pumpage by the filter action. A diverter plate (5)
located directly behind the inlet port (6) prevents the incoming pressurized
pumpage from directly impacting the filter elements (2 and 3) and equalizes
pressure across the inlet bulkhead (7). The coalescer elements (2) are
one-piece, closed-end, threaded-base elements and are retained to the inlet
bulkhead (7) by threaded-base adapters (8). The separator element (3) is a
one-piece, monel or stainless steel screen coated on both sides with Teflon.
It seats over a threaded rod (9) into a friction fit adapter (10) on the inlet
bulkhead (7). All four elements are retained in position at the cover (11)
end by a cross shaped element retainer (12). An O-ring (13) and a domed
aluminum cover (11) seal the access end of the vessel (1). Two handles (14)
```

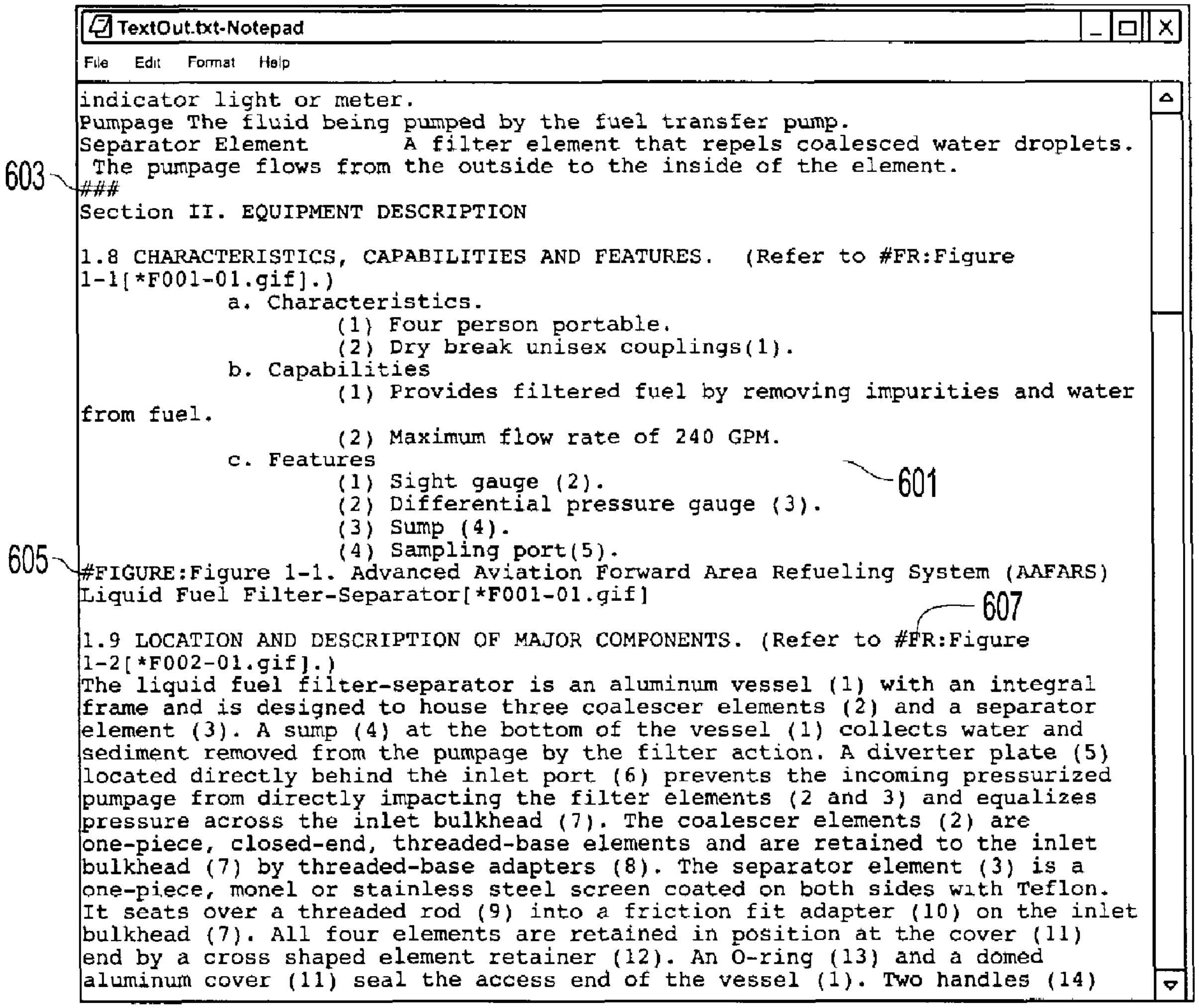

FIG. 7

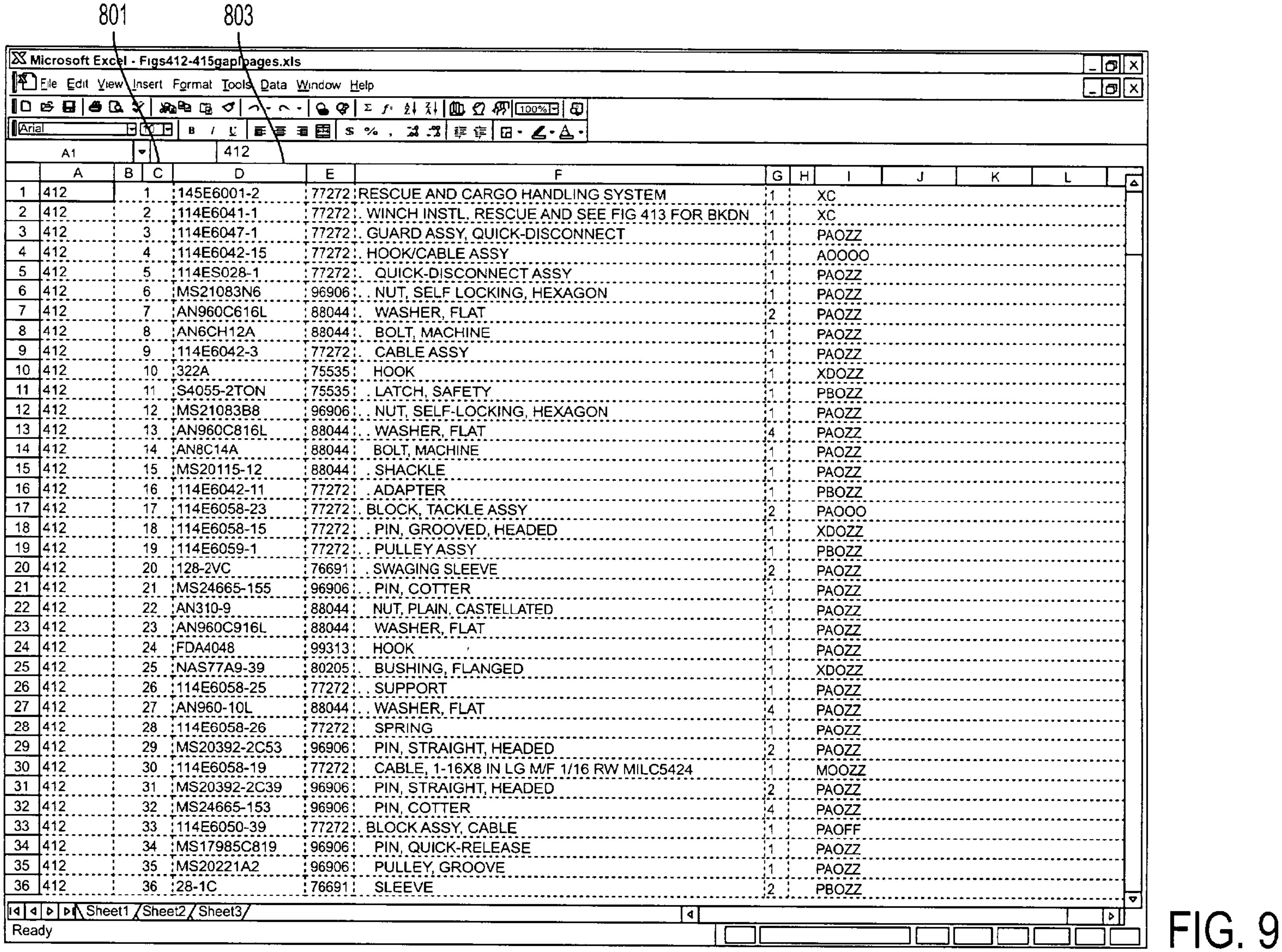

| | A | B | C | D | E | F | G | H | I | J | K | L |
|---|---|---|---|---|---|---|---|---|---|---|---|---|
| 1 | 412 | | 1 | 145E6001-2 | 77272 | RESCUE AND CARGO HANDLING SYSTEM | 1 | | XC | | | |
| 2 | 412 | | 2 | 114E6041-1 | 77272 | . WINCH INSTL, RESCUE AND SEE FIG 413 FOR BKDN | 1 | | XC | | | |
| 3 | 412 | | 3 | 114E6047-1 | 77272 | . GUARD ASSY, QUICK-DISCONNECT | 1 | | PAOZZ | | | |
| 4 | 412 | | 4 | 114E6042-15 | 77272 | . HOOK/CABLE ASSY | 1 | | AOOOO | | | |
| 5 | 412 | | 5 | 114ES028-1 | 77272 | .. QUICK-DISCONNECT ASSY | 1 | | PAOZZ | | | |
| 6 | 412 | | 6 | MS21083N6 | 96906 | ... NUT, SELF LOCKING, HEXAGON | 1 | | PAOZZ | | | |
| 7 | 412 | | 7 | AN960C616L | 88044 | .. WASHER, FLAT | 2 | | PAOZZ | | | |
| 8 | 412 | | 8 | AN6CH12A | 88044 | .. BOLT, MACHINE | 1 | | PAOZZ | | | |
| 9 | 412 | | 9 | 114E6042-3 | 77272 | .. CABLE ASSY | 1 | | PAOZZ | | | |
| 10 | 412 | | 10 | 322A | 75535 | .. HOOK | 1 | | XDOZZ | | | |
| 11 | 412 | | 11 | S4055-2TON | 75535 | ... LATCH, SAFETY | 1 | | PBOZZ | | | |
| 12 | 412 | | 12 | MS21083B8 | 96906 | ... NUT, SELF-LOCKING, HEXAGON | 1 | | PAOZZ | | | |
| 13 | 412 | | 13 | AN960C816L | 88044 | ... WASHER, FLAT | 4 | | PAOZZ | | | |
| 14 | 412 | | 14 | AN8C14A | 88044 | .. BOLT, MACHINE | 1 | | PAOZZ | | | |
| 15 | 412 | | 15 | MS20115-12 | 88044 | .. SHACKLE | 1 | | PAOZZ | | | |
| 16 | 412 | | 16 | 114E6042-11 | 77272 | .. ADAPTER | 1 | | PBOZZ | | | |
| 17 | 412 | | 17 | 114E6058-23 | 77272 | . BLOCK, TACKLE ASSY | 2 | | PAOOO | | | |
| 18 | 412 | | 18 | 114E6058-15 | 77272 | .. PIN, GROOVED, HEADED | 1 | | XDOZZ | | | |
| 19 | 412 | | 19 | 114E6059-1 | 77272 | .. PULLEY ASSY | 1 | | PBOZZ | | | |
| 20 | 412 | | 20 | 128-2VC | 76691 | .. SWAGING SLEEVE | 2 | | PAOZZ | | | |
| 21 | 412 | | 21 | MS24665-155 | 96906 | .. PIN, COTTER | 1 | | PAOZZ | | | |
| 22 | 412 | | 22 | AN310-9 | 88044 | .. NUT, PLAIN, CASTELLATED | 1 | | PAOZZ | | | |
| 23 | 412 | | 23 | AN960C916L | 88044 | .. WASHER, FLAT | 1 | | PAOZZ | | | |
| 24 | 412 | | 24 | FDA4048 | 99313 | .. HOOK | 1 | | PAOZZ | | | |
| 25 | 412 | | 25 | NAS77A9-39 | 80205 | .. BUSHING, FLANGED | 1 | | XDOZZ | | | |
| 26 | 412 | | 26 | 114E6058-25 | 77272 | .. SUPPORT | 1 | | PAOZZ | | | |
| 27 | 412 | | 27 | AN960-10L | 88044 | .. WASHER, FLAT | 4 | | PAOZZ | | | |
| 28 | 412 | | 28 | 114E6058-26 | 77272 | .. SPRING | 1 | | PAOZZ | | | |
| 29 | 412 | | 29 | MS20392-2C53 | 96906 | .. PIN, STRAIGHT, HEADED | 2 | | PAOZZ | | | |
| 30 | 412 | | 30 | 114E6058-19 | 77272 | .. CABLE, 1-16X8 IN LG M/F 1/16 RW MILC5424 | 1 | | MOOZZ | | | |
| 31 | 412 | | 31 | MS20392-2C39 | 96906 | .. PIN, STRAIGHT, HEADED | 2 | | PAOZZ | | | |
| 32 | 412 | | 32 | MS24665-153 | 96906 | .. PIN, COTTER | 4 | | PAOZZ | | | |
| 33 | 412 | | 33 | 114E6050-39 | 77272 | . BLOCK ASSY, CABLE | 1 | | PAOFF | | | |
| 34 | 412 | | 34 | MS17985C819 | 96906 | .. PIN, QUICK-RELEASE | 1 | | PAOZZ | | | |
| 35 | 412 | | 35 | MS20221A2 | 96906 | .. PULLEY, GROOVE | 1 | | PAOZZ | | | |
| 36 | 412 | | 36 | 28-1C | 76691 | .. SLEEVE | 2 | | PBOZZ | | | |

FIG. 9

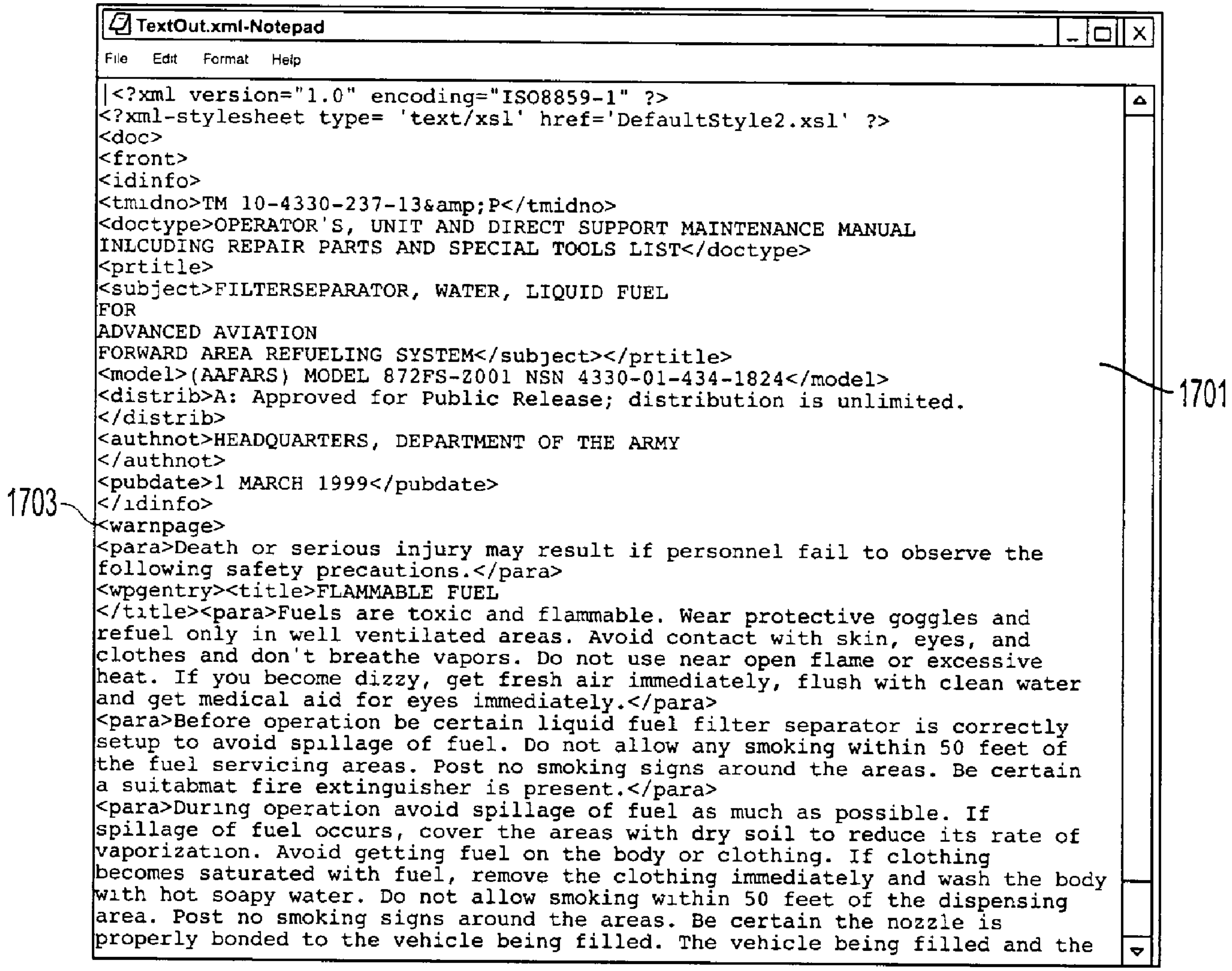

```
<?xml version="1.0" encoding="ISO8859-1" ?>
<?xml-stylesheet type= 'text/xsl' href='DefaultStyle2.xsl' ?>
<doc>
<front>
<idinfo>
<tmidno>TM 10-4330-237-13&P</tmidno>
<doctype>OPERATOR'S, UNIT AND DIRECT SUPPORT MAINTENANCE MANUAL
INLCUDING REPAIR PARTS AND SPECIAL TOOLS LIST</doctype>
<prtitle>
<subject>FILTERSEPARATOR, WATER, LIQUID FUEL
FOR
ADVANCED AVIATION
FORWARD AREA REFUELING SYSTEM</subject></prtitle>
<model>(AAFARS) MODEL 872FS-2001 NSN 4330-01-434-1824</model>
<distrib>A: Approved for Public Release; distribution is unlimited.
</distrib>
<authnot>HEADQUARTERS, DEPARTMENT OF THE ARMY
</authnot>
<pubdate>1 MARCH 1999</pubdate>
</idinfo>
<warnpage>
<para>Death or serious injury may result if personnel fail to observe the
following safety precautions.</para>
<wpgentry><title>FLAMMABLE FUEL
</title><para>Fuels are toxic and flammable. Wear protective goggles and
refuel only in well ventilated areas. Avoid contact with skin, eyes, and
clothes and don't breathe vapors. Do not use near open flame or excessive
heat. If you become dizzy, get fresh air immediately, flush with clean water
and get medical aid for eyes immediately.</para>
<para>Before operation be certain liquid fuel filter separator is correctly
setup to avoid spillage of fuel. Do not allow any smoking within 50 feet of
the fuel servicing areas. Post no smoking signs around the areas. Be certain
a suitabmat fire extinguisher is present.</para>
<para>During operation avoid spillage of fuel as much as possible. If
spillage of fuel occurs, cover the areas with dry soil to reduce its rate of
vaporization. Avoid getting fuel on the body or clothing. If clothing
becomes saturated with fuel, remove the clothing immediately and wash the body
with hot soapy water. Do not allow smoking within 50 feet of the dispensing
area. Post no smoking signs around the areas. Be certain the nozzle is
properly bonded to the vehicle being filled. The vehicle being filled and the
```

FIG. 17

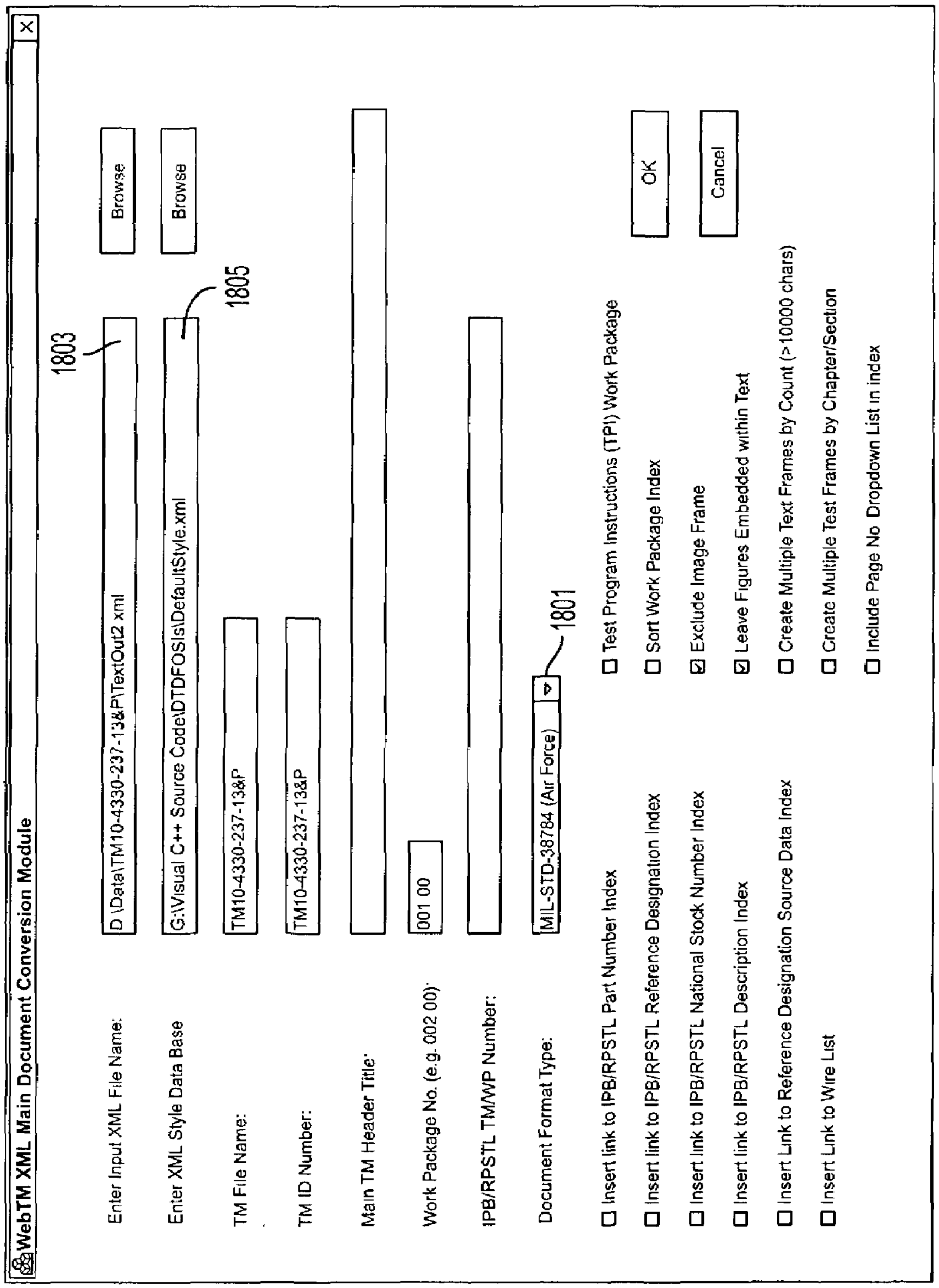

FIG. 18

WebTM XML Main Document Conversion Module

Enter Input XML File Name: D:\Data\TM10-4330-237-13&P\TextOut2.xml — 1803 — Browse Enter XML Style Data Base: G:\Visual C++ Source Code\DTDFOS\IsDefaultStyle.xml — 1805 — Browse TM File Name: TM10-4330-237-13&P TM ID Number: TM10-4330-237-13&P Main TM Header Title:

Work Package No. (e.g. 002 00): 001 00

IPB/RPSTL TM/WP Number:

Document Format Type: MIL-STD-38784 (Air Force) — 1801

☐ Insert link to IPB/RPSTL Part Number Index
☐ Insert link to IPB/RPSTL Reference Designation Index
☐ Insert link to IPB/RPSTL National Stock Number Index
☐ Insert link to IPB/RPSTL Description Index
☐ Insert Link to Reference Designation Source Data Index
☐ Insert Link to Wire List ☐ Test Program Instructions (TPI) Work Package
☐ Sort Work Package Index
☒ Exclude Image Frame
☒ Leave Figures Embedded within Text
☐ Create Multiple Text Frames by Count (>10000 chars)
☐ Create Multiple Test Frames by Chapter/Section
☐ Include Page No Dropdown List in index OK   Cancel

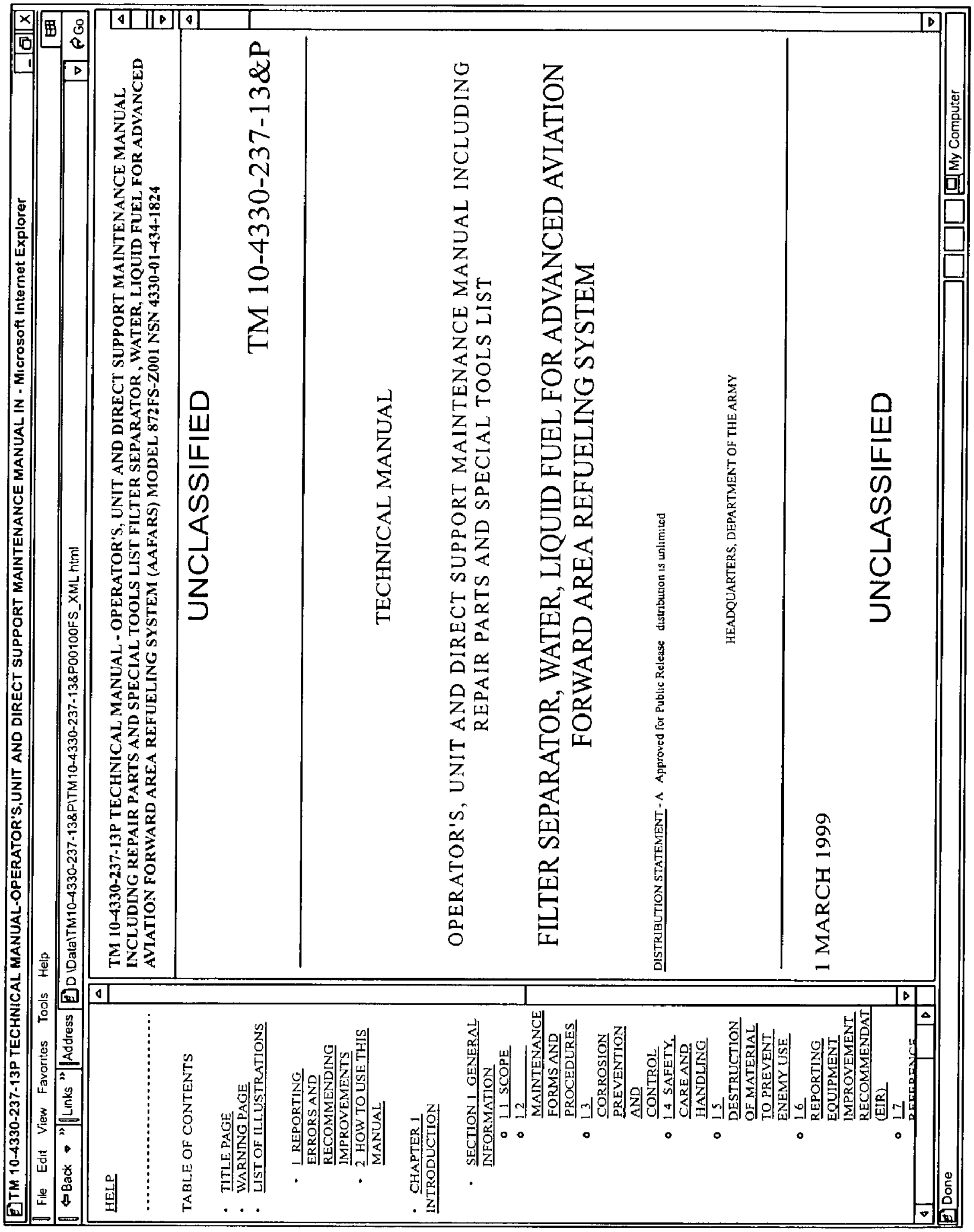

FIG. 19B

HELP

TABLE OF CONTENTS
- TITLE PAGE
- WARNING PAGE
- LIST OF ILLUSTRATIONS

- 1 REPORTING ERRORS AND RECOMMENDING IMPROVEMENTS
  - 2 HOW TO USE THIS MANUAL

- CHAPTER 1 INTRODUCTION

- SECTION I GENERAL INFORMATION
    - 1.1 SCOPE
    - 1.2 MAINTENANCE FORMS AND PROCEDURES
    - 1.3 CORROSION PREVENTION AND CONTROL
    - 1.4 SAFETY CARE AND HANDLING
    - 1.5 DESTRUCTION OF MATERIAL TO PREVENT ENEMY USE
    - 1.6 REPORTING EQUIPMENT IMPROVEMENT RECOMMENDAT (EIR)
    - 1.7 REFERENCE

---

TM 10-4330-237-13&P TECHNICAL MANUAL - OPERATOR'S, UNIT AND DIRECT SUPPORT MAINTENANCE MANUAL INCLUDING REPAIR PARTS AND SPECIAL TOOLS LIST FILTER SEPARATOR, WATER, LIQUID FUEL FOR ADVANCED AVIATION FORWARD AREA REFUELING SYSTEM (AAFARS) MODEL 872FS-Z001 NSN 4330-01-434-1824

UNCLASSIFIED

TM 10-4330-237-13&P

TECHNICAL MANUAL

OPERATOR'S, UNIT AND DIRECT SUPPORT MAINTENANCE MANUAL INCLUDING REPAIR PARTS AND SPECIAL TOOLS LIST

FILTER SEPARATOR, WATER, LIQUID FUEL FOR ADVANCED AVIATION FORWARD AREA REFUELING SYSTEM

DISTRIBUTION STATEMENT - A. Approved for Public Release  distribution is unlimited

HEADQUARTERS, DEPARTMENT OF THE ARMY

1 MARCH 1999

UNCLASSIFIED

2201

SYSTEMS AND METHODS FOR GENERATING INTERACTIVE ELECTRONIC REFERENCE MATERIALS

CROSS REFERENCE TO RELATED APPLICATIONS(S)

This Application claims priority to U.S. Provisional Patent Applications Ser. Nos. 60/336,192; 60/336,195; 60/336,204; and 60/336,206 all filed Oct. 31, 2001. The entire disclosure of all the above applications is herein incorporated by reference. This application is also related to United States patent applications entitled "Systems and Methods for Generating Interactive Electronic Reference Materials" with Mike Watson listed as inventor (U.S. application Ser. No. 10/285,296) and "Interactive Electronic Reference Systems" with Mike Watson and Frank Tricomi listed as inventors (U.S. application Ser. No. 10/285,349); both cases are filed concurrently herewith, and the entire disclosure of all of which is also herein incorporated by reference.

BACKGROUND OF THE INVENTION

1. Field of the Invention

This disclosure relates to the field of systems and methods for generating interactive electronic reference materials from non-interactive hard copy or soft copy reference materials, systems and methods for providing the interactive reference materials to a user, and systems and methods for combining interactive documents with other interactive services into interactive electronic reference systems.

2. Description of the Related Art

Reference materials, such as, but not limited to, technical manuals, operator's guides, maintenance guides, parts lists, instruction sheets and the like are used in almost every sector of the economy and are almost universally confined to paper. These reference materials provide for information pertaining to a device to which they refer. Therefore, those who are working with, maintaining, repairing, or servicing those devices using those reference materials need to have the device, themselves, and the reference materials in the same place at the same time so that the actions can be performed.

Throughout the years, many different ways have been attempted to make sure that the three pieces meet up at the same place. Many reference materials are printed to be attached to or carried with the device so when the serviceman arrives, the reference material is waiting there. While this solution provides for a high degree of likelihood of the three meeting, the problem lies in the cost of printing, transporting, and updating materials. Keeping reference materials with the device provides that there is usually a copy at the device when the serviceman arrives, but if a single serviceman services 100 similar objects, that results in there being printed 99 extra copies of the materials as the serviceman could have carried a single copy. This both wastes resources of paper and ink as well as storage and transportation resources devoted to storing and moving all that paper. However, if each serviceman was given a copy of the materials above, and 10 servicemen service the same device, resources are also wasted.

The need to change or modify written reference materials is also common. A problem exists in creating a change to a paper publication, delivering the change to every piece of equipment effected by the change, and ultimately posting or attaching the change to the written documentation which is often of fixed form. The gap between completing a change and finally getting it to the existing materials can often be as long as a year due to delays in printing, shipping, and posting. Further, even when the update arrives, it often is placed with the original reference material, not incorporated within it.

Nowhere are the above problems more acute than in the military. When a country is at war in a distant theatre it is imperative that up-to-date maintenance, operation, training and repair information (or other military reference material) be available at the fingertips of those who have to repair, maintain, service and use the systems fighting the battle. As war gets more sophisticated, the problems get larger as more complex systems require more and more documentation to support.

Currently, the United States military relies on paper manuals to operate, repair, and order parts for its machinery, both in peace-time and in war. Unfortunately, these reference manuals are growing more massive by the day. Further, so as to always make sure that anyone who might need a manual has access to the manual, there is a huge amount of repetition and redundancy of documents provided in the military. These manuals can cover everything from how to inflate tires, to how to identify and repair a non-functioning targeting computer. Every C-17 cargo aircraft carries more than 750 pounds of technical manuals, basically the equivalent of 4 additional passengers. Every tank carries technical manuals covering everything from its main gun, to its radios, power plant, turret, electronic data bus, and so on. Support units must carry manuals for everything they support. Further, a general or direct support maintenance unit will carry literally hundreds of manuals covering the myriad of products and systems found in a combat organization. The technical manuals required to support the Family of Medium Tactical Vehicles (FMTV) number in excess of 25,000 pages. Further, there are more than 30,000 of these vehicles in the U.S. Army in hundreds of different units deployed around the world. Every one of these units has to carry, maintain, store, and protect these manuals.

It should be apparent that logistically the transport of all these reference materials results in a gargantuan amount of wasted transport space, wasted fuel in hauling paper, and wasted space within military systems as many of these manuals will simply be unneeded as that device does not require maintenance, or, when it does, it is located somewhere where there is another copy of the reference. Hollywood has previously poked fun at exactly this problem with individuals throwing manuals out of airplanes so they can take off, or similar situations where the space and weight of manuals is simply seen as pointless because the manuals are not needed.

The reason for all these reference materials, however, is clear. It is unknown which particular copy of which reference document will be needed by what particular person at what time. Therefore, the only solution to allow for universal access was to provide all the reference materials to everyone who might need them and with all the devices to which they are associated, so when the need is determined, the material is available.

In addition to the space that these reference materials take up, printed reference materials often have the problem of being self-contained while still requiring internal and external reference. That is, the material is in a fixed format which can not be altered. The paper reference document is defined by what is between the covers, and updates made to the material therein require the use of separate reference documents, each of which must be posted to one of the originals, and that require cross-referencing therebetween. Even within a document, referencing to other pages and/or sections is regularly necessary to make the document as a whole vaguely useful as the single order layout mandated by paper publication is rarely entirely sufficient. This cross-referencing, however, requires a user to stop what they are doing and spend time searching the document for what they need next. While this process is simplified through indexing such as tables of contents, page numbers, footnotes, and indexes, the process is still less than ideal and just about everyone has had a reference book held open with pens, papers, fingers, wrenches or other items stuck in pages so that the disclosure of those pages can be located quickly as work progresses and the material is needed. This fixed presentation of the resource material is because the document is not interactive. That is, the document cannot know what the user wants to look at next, and therefore the chosen format of the author may be completely wrong. Again, this problem becomes even more acute in the military as different components of the same device may have been built by different contractors so an operation may be described in one document and continued into another, or the explanation of a part may be in a different document than the one which tells you how to remove the part, which is in a still different document to the one which tells you when to know that the part might have failed.

Yet another problem with paper reference materials in the military is making sure they are secured. Many of these materials include classified information related to the operation and limitations of these devices and the reference materials may be carried to the front lines (as that is where the device they relate to is going) where they can potentially be captured by enemy forces. Therefore, it is often necessary for the crew of a plane, tank, or truck, to have the time to destroy the materials they carry before they are captured, something which is often not possible and further often requires the inclusion of incinerators or other machines in the vehicle, taking up yet more space and more weight.

Even as documents have become electronic, many of the problems still remain. Computer form documents are still slaved to the layout they had in paper form. Some documents may include rudimentary linking (such as indexes or tables of contents) but these are generally confined to a single reference document and further do not provide for interlinking between multiple sections, much less multiple documents as exists in an interactive system. Further systems with rudimentary linking generally require massive numbers of man-hours to produce and there are no systems which allow for the rapid conversion of paper or plain-text documents into interactive electronic documents.

SUMMARY

Because of these and other previously unknown problems in the art, it is therefore desired to have electronically available interactive reference materials (particularly military reference materials) that can preferably be accessed by using a browser, either from local storage media or over a network, such as the World Wide Web or Internet, to eliminate the need to create and transport paper. It is further desirable that these reference materials allow a user to move about within a document, or between documents, as they perform a task described in the various materials. Finally, it is desirable that the interactive documents be combined with other interactive services so that the interactive systems are more than an electronic reference and can play an active roll in the work being performed.

In this document, the following terms generally have the meanings provided below, but these meanings are not intended to limit the clear scope and meaning of any of these terms as known by those of ordinary skill in the art.

'Reference materials,' 'reference,' or 'reference document' generally refers to any type of matter which may be used for reference. Typical reference material will be of a printed form, either graphical or textual in design, providing for an indication of some type of fact for reference to something other than the printed form itself. Reference materials specifically include, but are not limited to, technical documents, operator's manuals, training manuals, maintenance guides, repair guides, instructions, parts lists, price lists, disclosures, treatises, textbooks, and reference books. While most reference materials in this disclosure are presumed to originally be in paper form and to generally be "manuals," it is easily understood that hard copy or soft copy forms of a reference still both constitute a reference as do documents other than manuals. Further, a single reference document need not be a complete document, but may be a portion of a document such as, but not limited to, a paragraph, an isolated figure, a chapter, or a page.

'User' generally denotes an entity, such as a human being, using a device, such as a computer. This is typically a computer having a keyboard, a pointing device (such as a mouse or stylus), and a display device (such as a monitor), with the computer running software able to display computer-originated material typically received from one or more separate computers or on board storage media. Preferably, the user's computer is running browser software enabling it to act as a client and communicate by the Internet to one or more servers. The user can, however, be any entity using any type of client.

'Browser' generally denotes, among other things, a process or system that provides the functionality of a client, such that it interconnects by a network to one or more servers. The browser may be Microsoft's Internet Explorer, Netscape's Navigator, or any other commercial or custom-designed browser or any other thing allowing access to material on a network. A browser can also be a process or system designed for network access, even if not used to access a network but only to access storage media local or native to a client.

'Client' generally denotes a computer or other thing such as, but not limited to, a PDA, pager, phone, WebTV system, or any software or hardware process that interconnects by a network with one or more servers.

'Server' generally denotes one or more computers or similar devices that interconnect by a network with clients and that have application programs running therein, such as for the purpose of transferring computer software, data, audio, graphic and/or other similar material. A server can be a purely software based function. Server also includes any process or system for interconnecting via a network with clients.

'Network' generally denotes any collection of interconnected clients and servers whether or not such connection is maintained or any client or server may leave the network at any time. A network specifically includes, but is not limited to, the Internet, the World Wide Web, any extranet system, any intranet system, a telecommunications network, a wireless network, a media broadcast network (such as, but not limited to, a broadcast television network, a broadcast radio network, or a cable television network), a satellite network, or any other private or public network.

'HTML' is an abbreviation known to those of ordinary skill in the art for HyperText Markup Language.

'XML' is an abbreviation known to those of ordinary skill in the art for eXtensible Markup Language.

'XSL' is an abbreviation known to those of ordinary skill in the art for eXtensible Stylesheet Language.

'ASCII' is an abbreviation known to those of ordinary skill in the art for American Standard Code for Information Interchange.

In an embodiment, there is described herein a method for converting reference materials into interactive reference materials comprising: obtaining at least one reference document in a computer readable form; searching the reference documents for a piece of reference text having a pre-determined value; tagging the reference text with a tag indicating a reference text type; repeating the steps of searching and tagging until all pieces of reference text have been tagged; associating patterns of the tags to a global control; replacing at least two of the patterns with a new tag from the global control; linking a first piece of reference text with a second piece of reference text based on the new tags; converting the at least one reference document into a browser readable format; allowing a user to access the reference documents from a client; and providing to the user the ability to jump from the first piece of reference text to the second piece of reference text.

In an embodiment, the step of obtaining may comprise scanning a paper document and performing text recognition, obtaining a file in XML, and/or converting ASCII text into XML. In an embodiment, the steps of searching and tagging may include hot-spotting and/or the tags and/or new tags may comprise XML tags. The step of tagging may additionally or alternatively be performed by a computer and/or in a semi-automated fashion.

In another embodiment the global control may comprise a database which may in turn comprise a Document Type Definition (DTD) which may in turn include at least one of Army 2361A, Air Force 38784, and Navy 3001. In another embodiment the step of converting may comprise converting the reference documents into HTML or into an HTML frame, XML, and an XSL style sheet. The reference document may comprise a military document which may include, but is not limited to, a maintenance manual, a repair manual, an operator's manual, an Integrated Parts List (IPB), and/or Repair Parts Special Tools List (RPSTL).

In another embodiment, the client comprises a computer which may access the reference document from a server via a network., access the reference documents from storage media local to the client, and/or perform the steps of linking and converting.

In another embodiment, there is described a system for converting reference materials to interactive reference materials comprising: a reference material in a computer readable form; a computer; and software running on the computer; wherein the software searches the reference material for a first piece of reference text and generates a link from the first piece of reference text to a pre-determined point, such as, but not limited to, a second piece of reference text, elsewhere in the reference material without removing the first piece of reference text to a separate file.

In another embodiment, there is described a method for converting reference materials into interactive reference materials comprising: obtaining at least one reference document in computer readable format; converting the reference document to include XML tags; searching the reference documents for XML tag combinations corresponding to values in a global control; replacing the XML tag combinations with a new XML tag referenced to the global control; and associating at least one of the new XML tags with a hyperlink directed to a location in the document separate from the new XML tag.

BRIEF DESCRIPTION OF THE FIGURES

FIG. 2 provides pages from a non-interactive reference document showing different types of text.

FIG. 7 shows a computer screen display of text after being run through the system of FIG. 6 from the first embodiment of conversion software.

FIG. 9 shows an embodiment of a computer screen display of a spreadsheet including tabular text from the first embodiment of conversion software.

FIG. 17 shows an embodiment of a computer screen display of XML text after mapping with global controls from the second embodiment of conversion software.

FIG. 18 shows an embodiment of a computer screen display of a conversion module for converting the text of FIG. 17 into HTML or into an HTML shell utilizing XML and an XSL style sheet from the second embodiment of conversion software.

FIG. 19B shows an embodiment of a computer screen display of an interactive manual from the second embodiment of conversion software utilizing an HTML shell, XML, and an XSL style sheet.

DETAILED DESCRIPTION OF PREFERRED EMBODIMENT(S)

Although the document conversion systems and methods discussed herein primarily relate to computer software used for converting paper or software based military equipment manuals and related references into interactive reference materials and serving those interactive reference materials through a network from a server to a client, one of ordinary skill in the art would recognize that the systems and methods below could alternatively be used for many other types of conversion such as, but not limited to, conversion of other military documents, conversion of non-military reference materials, or conversion of any other printed matter into interactive electronic versions for any reason. Further, one of ordinary skill in the art would recognize that serving of the reference materials using a network structure is merely one of many ways a user can use interactive reference materials and interactive systems according to the disclosures herein and in other embodiments the reference materials could be located on storage media associated with a particular client disconnected from any networks. One of ordinary skill in the art would also recognize that the interactive reference materials served via a network could be joined to any other interactive service in addition to, or instead of, the interactive services described herein.

Figure 1:
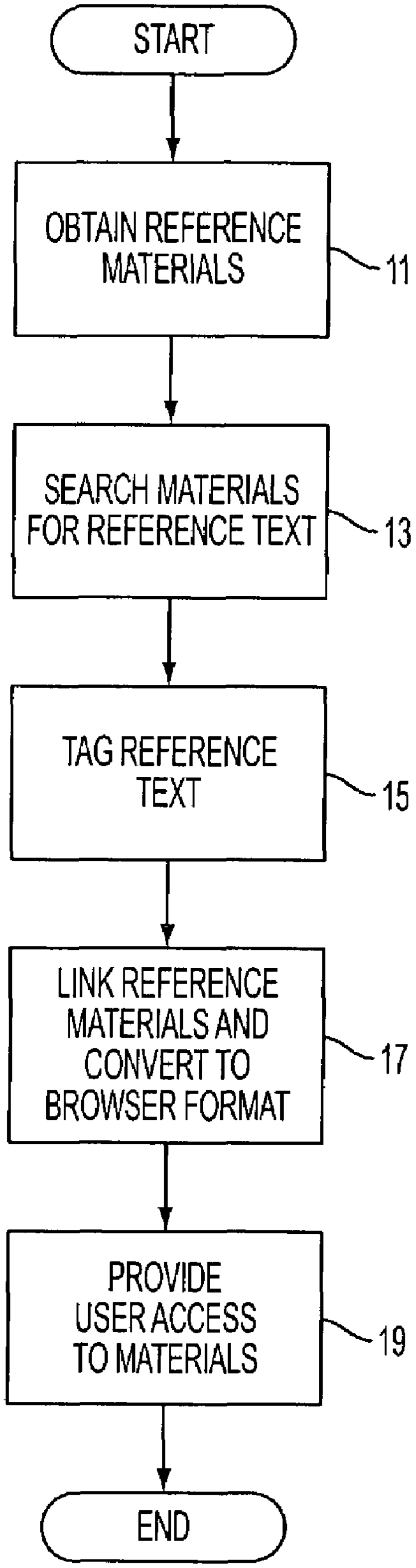
FIG. 1 provides a flowchart showing general steps for converting non-interactive reference materials into interactive electronic reference materials.

FIG. 1 provides for a general overview flowchart of the process undertaken in this disclosure to generate interactive reference materials from non-interactive originals. First, in step (11), non-interactive reference materials are obtained in a computer readable form. Within these reference materials, there will be included reference text.

Each piece of reference text comprises text which serves to provide a connection, reference point, or link within the reference materials (or to other reference materials) to a location where related disclosure may be found and other than the disclosure currently being examined. Alternatively or additionally, a piece of reference text may also indicate a location, by its own placement, where another piece of reference text leads to. By way of example, a table of contents comprises very simple reference text. The table provides little information other than where to look in the document for information from a certain chapter, the subtitles (and/or page numbers) in the document to which the table of contents refers is also reference text as it is what is linked to. Linking the opposite direction is also possible (although not likely). In the same way, a figure number comprises reference text as it allows the interconnection of the user from text referencing the figure to a pictorial drawing of the figure. This patent disclosure will in fact utilize exactly this type of reference text where a written description of a part refers to a portion of a drawing and vice-versa. In non-interactive reference material the user wishing to follow the reference text must search through the material to locate the reference. This will generally, but not always, require flipping to a different page, but alternatively can simply be looking elsewhere on the same page or looking in a different document.

The easiest way to determine that something is reference text, is that the reader of reference text is implicitly intended to look somewhere else upon seeing the text or is implicitly intended to find the text from somewhere else. This includes such things as, but is not limited to, figure numbers, internal figure references (index numbers), labels, tables of contents, page numbers, footnotes, or other things which direct attention elsewhere. Reference text can also be text which indicates it is at the location the user is supposed to go when referred there. A reference to "see FIG. 1" in text is generally useless if figures are unlabeled. Therefore reference text also includes the indications to which the user is indicated to go. In particular, if text says "see FIG. 1" the user is generally directed to a related text "FIG. 1" labeling a particular figure. The dual nature of reference text is logical because a reference generally goes both ways, a user looking at "FIG. 1" from the prior example may search the text for references to "see FIG. 1" to locate textual information related to the figure.

Reference text will be included within "disclosure text" which is anything providing information to the user and is the text the user is reading when using the reference material. This could be a description of the part associated with reference text (e.g. "bracket" is disclosure text associated with reference text "9") For ease, disclosure text is generally broken into three subtypes which relate to how that disclosure is provided and which relate to how the disclosure is searched for reference text. Pictorial text is disclosure which is primarily graphic in nature, this includes, but is not limited to, drawings, pictures, and diagrams. Reference text is usually easily segregated from pictorial disclosure text as the reference text is usually reference words or numbers within the picture or associated with the picture. Prose text is designed to be read to provide meaning from traditional grammatical formation. That is, prose disclosure text is words, sentences, and paragraphs lexicographically describing what the reference text refers to (e.g. "bracket" above). Tabular disclosure text is prose text where the meaning of the text is not so much obtained from grammatical rules, as from pictorial or graphical placement of the text within a page. This is, for example, a table, spreadsheet, balance book, or similar type of text where the text primarily has meaning from its placement on the page with regards to the placement of the reference text and other text.

FIG. 2 provides for pages from a reference manual showing different types of text. There is pictorial text (90), prose text (92) and reference text (94). This particular reference does not include tabular text. One can see how the text is effectively mixed in the reference but a user, when reading the prose text (92) for instance, is referred to the pictorial text (90) by the reference text (94). FIG. 2 also provides a good indication of the implicit searching as a user would read the prose text to understand the operation, trouble-shooting, and maintenance for the depicted device, but must refer from the prose text to the figures to understand what device is referred to. To give another example, a reader of this paragraph is implicitly referred in the prior sentences to a different page (that including FIG. 2), making this paragraph itself a combination of reference text and disclosure text. One of ordinary skill in the art would recognize that reference text can disclose and disclosure text can reference, these terms are simply used to describe different types of text having different functions as used herein.

Returning to FIG. 1, once reference materials have been obtained into a computer readable format, the reference document is searched to locate all reference text in step (13). As the reference text is located it is "tagged" as reference text in step (15) of a particular type based on the type of disclosure text it appears in and what type of reference text it is. The tag will also be associated with the particular value of the reference text. For instance, a reference to a figure index number can have a tag which indicates that the particular reference is an "index number" (a number referring to a part within a figure) the value of that reference text is then the actual text that is there (for instance "9"). Each piece of reference text is therefore tagged so that, once completed, each piece of reference text includes a tag and a value. In some cases the tag may be textual or programmatical tags (such as tags used in HTML or XML) or may be simple textual formatting (e.g. a number in "( )" is reference text of an index number type).

The tagging, in an embodiment, occurs in an automated or semi-automated fashion through a computer scanning through the text of the document and inserting tags based on patterns it finds. The tagging, preferably marks similar reference text similarly across different reference materials if they are similar. Once the tagging has been completed, reference text is linked with the reference material where related occurrences of reference text (tag/value combinations) occur in step (17). That is if two items of reference text are both referring to "FIG. 1," those two pieces of reference text will usually be linked together in some manner. This need not be direct linking. This step creates the interactivity of the documents. By following the linking, the user can quickly go from one piece of reference text to a corresponding piece of reference text in the available reference material.

It is preferred in this step that the linking be defined according to a particular scheme of understanding. In particular, if there are three tag/value combinations which are related, there can be any connections between them. However each particular piece of reference text will generally only have a single location that it can link to. Therefore, the arrangement of links generally allows for logical progression (or chaining) of the links. In this way, associated disclosure is available in a logical way and as it is likely to be needed by the user. This pattern is, however, by no means required.

One of ordinary skill in the art would understand that the term "linking" is used purposefully herein. In an embodiment, it is intended that each piece of reference text so linked actually allow a user to jump from the material originally displayed to him on a computer screen to a new display including the reference text linked to. To put it generally, a user reading "see FIG. 1" need only indicate that they wish to view FIG. 1 to be taken to a display showing FIG. 1. In an embodiment, this linking is performed by the use of an HTML or similar hyperlink structure within the computer files for the reference materials where a user clicking on a piece of linked reference text is taken to another piece of linked reference text, clicking on the new piece takes the user to another piece of linked reference text, and so on until a logical pattern of all pieces of reference text has been completed. The reader should note that a user "going" between files generally means that different files are made available for viewing on their display.

During the step (17) of linking, the documents may also be converted into a more universal format. This will generally be a format readable by numerous different computers. It is preferable that this format comprise a browser-readable computer code such as HTML, XML, SGML, JavaScript or the like, but any type of language or format may be used. In an embodiment, HTML or other network language is chosen so that the user can access the reference materials (which are stored on a server or servers in an embodiment) from any client through the use of a network.

In step (19), the materials are made available to a user for his access via a network or by being provided on storage media for use on a standalone machine. Generally, the materials will be provided so that they can be viewed through a browser and reference text can be followed via embedded hyperlinks wherever it appears. The hyperlinks therefore provide interactivity allowing rapid switching from different points within reference documents, and separate, but related reference documents which are available. In this way, reference documents can be made interactive and reference materials can be interlinked with each other. Further a user can have a computer with which they can access the interactive reference system, and review materials as they need them by following the linking as they perform the operation desired on the device to which the reference materials refer. One can see from FIG. 1 that the interactive linking provided effectively unifies disparate parts of reference materials, and in fact disparate reference materials into readily accessible interactive electronic reference materials.

Figure 3:
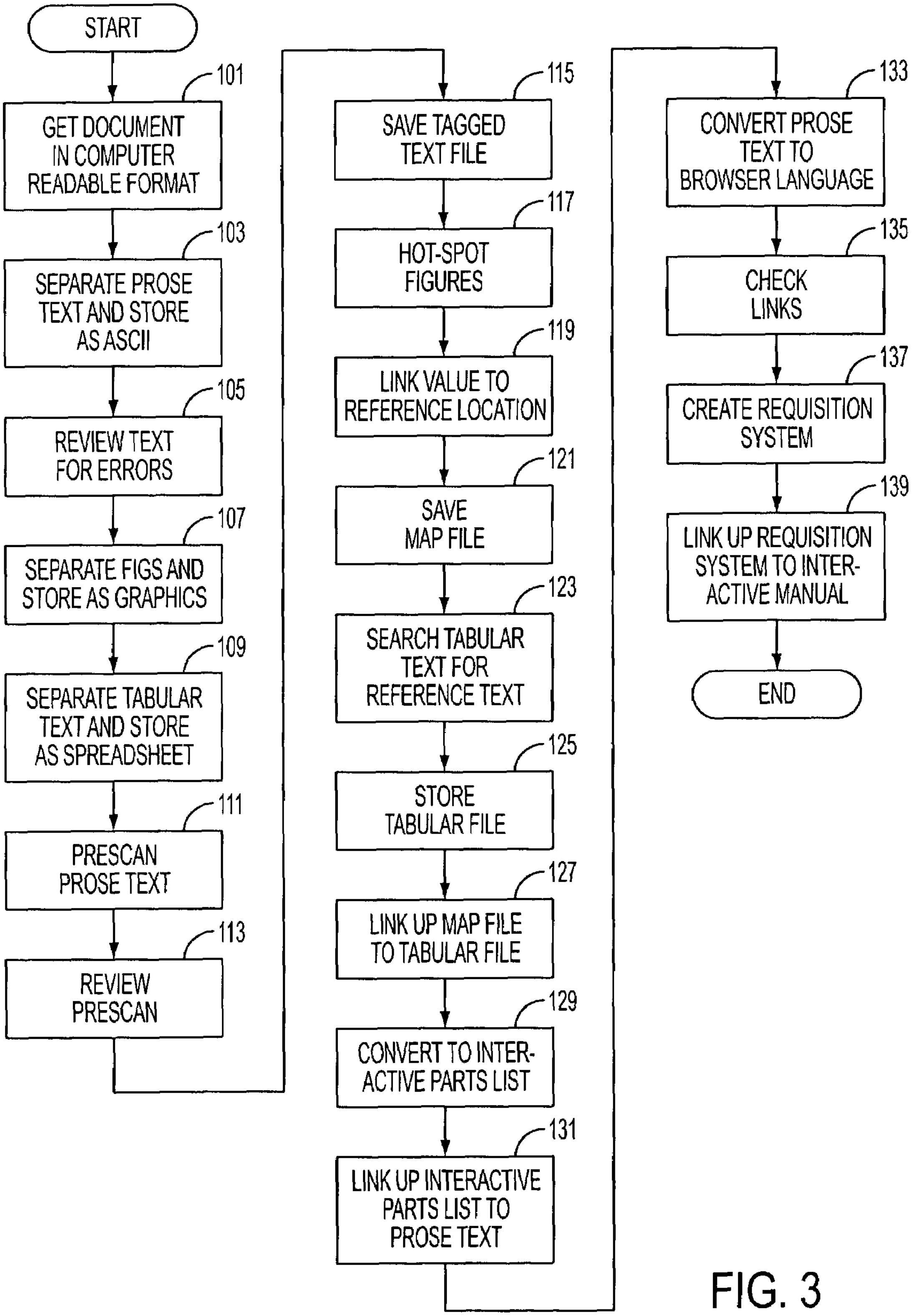
FIG. 3 provides a flowchart showing the conversion of reference materials into interactive reference materials, and the setup of an interactive library and related systems for use by a user in a first embodiment of the invention.

While FIG. 1 provides for a general overview of the process which is performed, the process is most easily understood by examining its operation in specific embodiments. In the first embodiment of conversion, there are disclosed systems and methods for converting a paper manual into an interactive reference document. This embodiment can be accomplished in a completely automated manner without human intervention, or in a semi-automated fashion where human intelligence is used to check the machine's work and/or deal with unique problems. FIG. 3 provides the general flowchart of a first embodiment of the steps of a conversion that can be taken by conversion software running on a computer. Later FIG. 13 will provide a second embodiment. In step (101), a reference document is obtained in a computer readable form regardless of its original form. The prose disclosure text is separated from the pictorial disclosure text in step (103) and the text is saved as raw ASCII text into a text file, which may then be checked for errors in step (105). Each of the figures or pictorial disclosure is independently saved as a graphical file in step (107). If there are any specific parts lists or other large tabular disclosure text present, these can also be separated and stored in step (109) or can be processed with the prose disclosure text (as discussed later). Once the document has been separated into various types of disclosure text with each type in a selected file, the different files can be formatted into tagged files. These steps can be performed sequentially (as shown or in any other order) or could alternatively be performed simultaneously as would be understood by one of ordinary skill in the art. The prose disclosure text file goes through a pre-scan evaluation which serves to recognize textual formatting issues of the prose text based on the type of document present and tags them based on expected textual structure in step (111). This step (111) also can perform a first pass scan for reference text within the textual file. The value of the reference text is noted and the reference text is tagged as the appropriate type of reference text to create the tag/value combinations. After the pre-scan has completed, in step (113), the pre-scan text may be reviewed to correct any oversights or mislabeled entries, if desired, and the tagged text file is then saved in step (115).

Either after, before, or during the pre-scan and review of the prose text (steps (111), (113), and (115)), the graphical files of pictorial disclosure text are hot-spotted in step (117) to locate and tag the reference text within them. The tags are then linked to the appropriate reference text values in step (119) so as to create a graphical map file showing the locations of all reference text within the figure. This map file is then saved in step (121).

Either before, during, or after the pictorial text steps ((117), (119), and (121)), tabular disclosure text may be separately analyzed. While tabular text may be analyzed with the prose text in steps (111), (113), and (115), large tables or other tabular text may be handled separately as the tabular text may be intended to stand alone as a portion of the document, or may simply be easier to analyze when the pictorial representation can be maintained. In step (123) tabular text is analyzed to search for any reference text therein. Again, the reference text value is recorded and the text is tagged. The tabular file is then stored in step (125).

In the next step (127), which may be performed after other linking steps as files can be linked in any order once created, the map file is linked to the tabular file. To link, tagged reference text (that which has the associated tags and values) in the two files are linked together based on relationships therebetween. This is generally performed by an automated or semi-automated process. This linking may be a double link where each piece of reference text refers to the other or a single link where only one file refers to the other (e.g. there is a referring and a referred to file). These links are generally created as HTML (or similar) hyperlinks between the two locations within the documents. At this time, the two linked files are also converted into HTML, JavaScript or another browser-readable language so that they can be accessed by a client as in step (129) to provide for an interactive reference (in this particular case, an interactive parts list). The HTML conversion allows for the tags to specifically be converted into HTML instructions so that formatting, labeling, etc., of text is also placed into the resulting HTML document.

If this is all that is desired, the system may be halted at this point. However, this is simply a part of the available reference materials. In the following step (131), the prose text file is linked to the above interactive parts list and converted into a file to be accessed by clients in step (133). This is similar to steps (127) and (129) where the reference text is converted into appropriate HTML links (and link targets) and the prose disclosure text is HTML formatted. In the prose text case, the inclusion of formatting tags back in step (111) also allows for the machine performing the conversion to locate the tags, and place HTML formatting instructions therein for appearance purposes. In this way, the text is formatted within HTML for screen display at the same time that it is being converted. The use of the HTML formatting allows for a more uniform appearance of textual prose across multiple references. There can also be included software functionality and a step of checking the resulting files of the interactive reference materials, once those files are created and converted into a browser-readable format. The step (135), of checking can be automated with a computer program checking that all the links created by the system actually lead somewhere, and there are no broken connections within the document.

Once again, if this is all that is desired, the process can be halted at this point, however the interlinked files can still be linked to other files or services which may also be available on the client or over the network. In step (139) the reference files are linked to another system, such as a requisitioning system, which is also available and may have been created in step (137). Further, multiple files and services can be connected to multiple other files and services in this way so as to produce an interactive reference system.

Once the interactive reference system has been created, it can be stored on a computer, such as a server, or on any type of storage media. To access the interactive reference system in an embodiment, the components may be loaded onto storage media accessible by a computer or the reference system may be made available over a network, such as the Internet. The use of the above embodiment of an interactive library over the Internet (or other network) by a soldier in the field is explained with reference to the flowchart in FIG. 4A and the diagram in FIG. 4B.

A soldier in the field (201) has need to perform maintenance on a particular system (203) such as a damaged tank, the soldier (201), in step (301), takes a client (205), which will generally be a battle hardened portable computer or similar device, and connects to a server (207) on the Internet (209) using a browser resident on the client (205). In the next step (303), the soldier may be required to pass various security measures to insure that the soldier (201) is authorized to access the information they wish to access from the server (207). These security measures may include, but are not limited to, passwords, keys, digital signatures, biometric systems, or any other type of security system.

The server (207) in step (305) then sends the requested reference materials to the client (205) and the soldier (201). This will generally be a prose text reference document such as a manual for repairing the device (203). The soldier (201) then utilizes the reference text links in the material they received to obtain additional information as needed during the repair work in step (307). This may be through regular downloading from server (207) or from within information already transferred from the server (207) to the client (205). The soldier has quick access to any necessary material that is available in the reference system.

During the soldier's (201) work on system (203), he discovers that a part is broken at step (309). The soldier (201) then accesses a parts list through a picture of the broken part so the parts list is already referenced to the broken part in step (311). The soldier (201) then accesses a requisition system on the server (207) in step (313), and completes a purchase request for the part in step (315). He may then print out and send this purchase request the traditional way, or may complete an electronic order in step (317) purchasing the part using electronic forms which are sent to the Internet (209) and forwarded to a commerce server (211) in step (321). The commerce server then provides the order to the facility (213) in step (323). The facility (213) fills the order in step (325) and sends the part (215) to the waiting soldier (201) which is received in step (327).

Figure 4A:
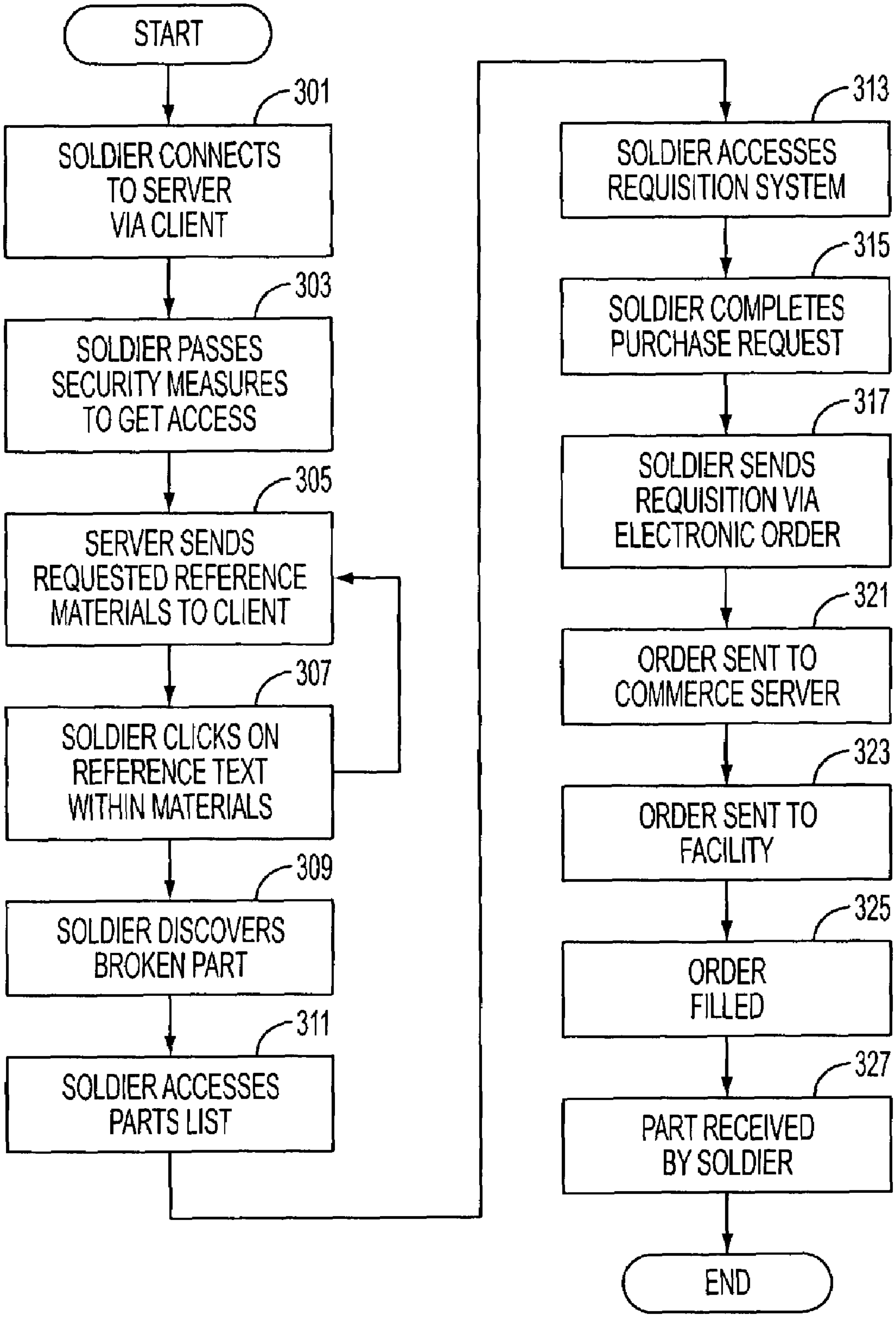
FIG. 4A provides a flowchart showing an example of how a soldier can utilize an interactive reference system in the field to order parts and perform repairs.
Figure 4B:
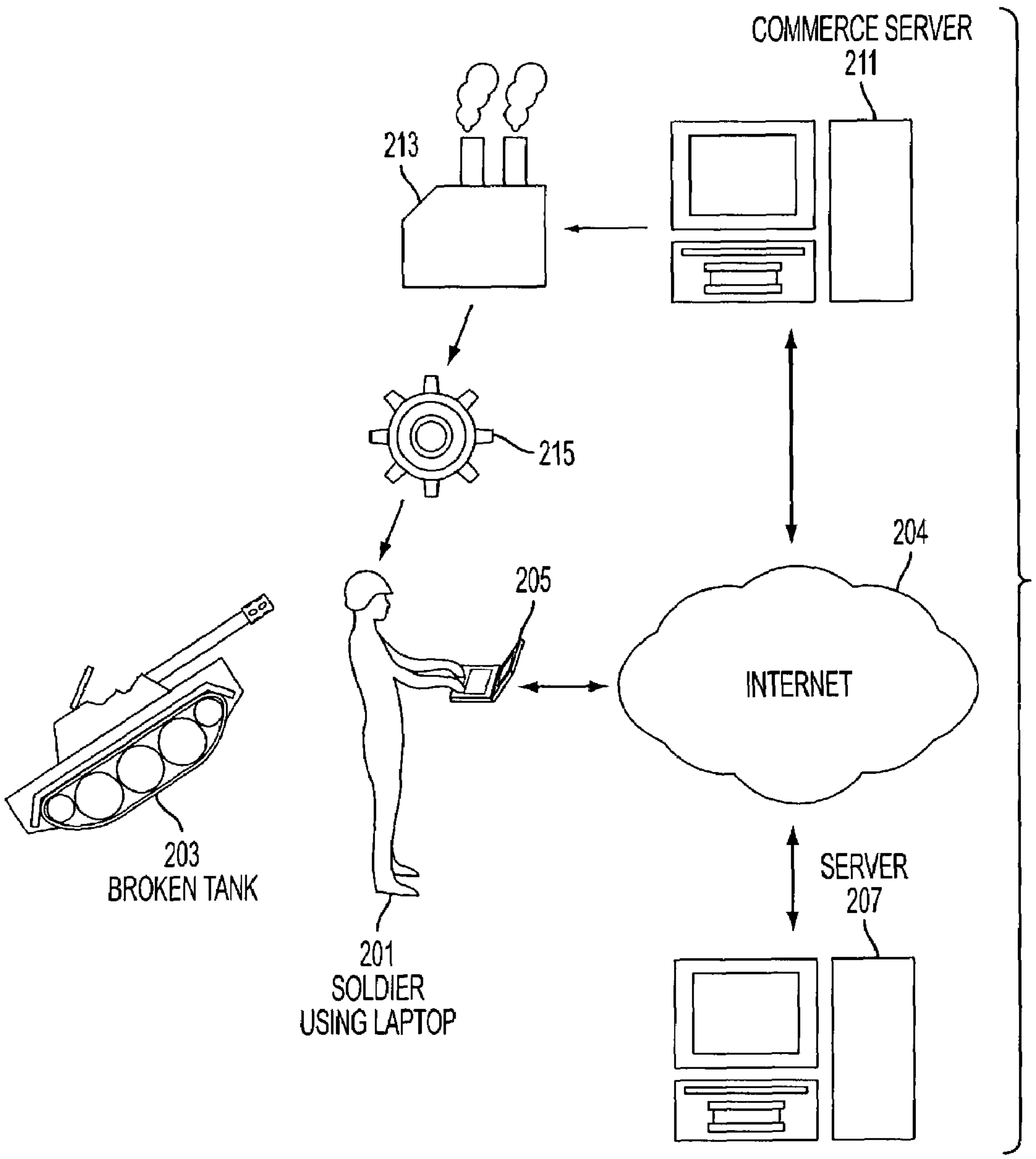
FIG. 4B shows the flow of requests and information during the use of an embodiment of an interactive reference system.

While FIGS. 4A and 4B describe an embodiment where the client accesses the information from a remote server via a network, such as the Internet, one of ordinary skill in the art would understand that in an alternative embodiment, the interactive reference system could actually be stored on storage media resident at or otherwise associated with the client, whether permanent or removable. In this embodiment, the network connection is not required and the server functionality can be local to the client. The storage media could include, but is not limited to, Compact disk (CD) or other removable optical memory, floppy disks or other removable magnetic memory, hard disk(s) or other resident memory, Random Access Memory (RAM), Read-Only Memory (ROM), or any other type of storage media known to those of ordinary skill in the art. This embodiment may still operate using browser software and a client/server-type architecture but with the functions of the server being local on the client. In a still further embodiment some functionality can be found and other functionality available via the network.

To describe the steps of FIG. 3 in greater detail, an embodiment of a computer system for converting of an existing paper manual into an interactive manual and ordering system will be described in conjunction with FIGS. 5-12. This embodiment will be shown from various computer screens showing what a human user might see and do to carry out the conversion assisted by a conversion computer. Further, this embodiment uses HTML text formatting and tagging to provide for resulting files which are placed on a server.

As previously discussed, in step (101) the document is obtained into a computer readable format from the original document. In some cases, the document will already be available in a computer readable format (e.g. as a word processor file). However, because of the multitude of software available to manipulate text, the text is converted in this embodiment into a simple text format so that changes in formatting can be eliminated and replaced by a universal formatting. The universal formatting eliminates formatting performed to make the document look correct in the resulting hardcopy paper printout but being of non-standard computer language form. Different typists may use different formatting to accomplish the same appearance (e.g., one typist may have centered text on a page using a word processor's "center" command, while another may have centered the text using a combination of tabs and hard returns). In many documents these methods will be indistinguishable in appearance, but very different in machine understanding, so they are removed.

In this embodiment, the prose text of the document is converted to raw ASCII text in step (103) to remove the formatting. Depending on the type of initial document available, this may be performed through a variety of methods. If the initial document is a hardcopy or paper printout (which will often be the case), this step will generally be considered to involve scanning in the paper document and performing text recognition on the result which is then stored as ASCII raw text. In another embodiment, any other method could be used to get the text into a computer readable format including, but not limited to, entry of the text via keyboard from a source document, or since many paper documents are now originally generated on computer, loading of a computer file that is then converted to a raw text format.

Figure 5:
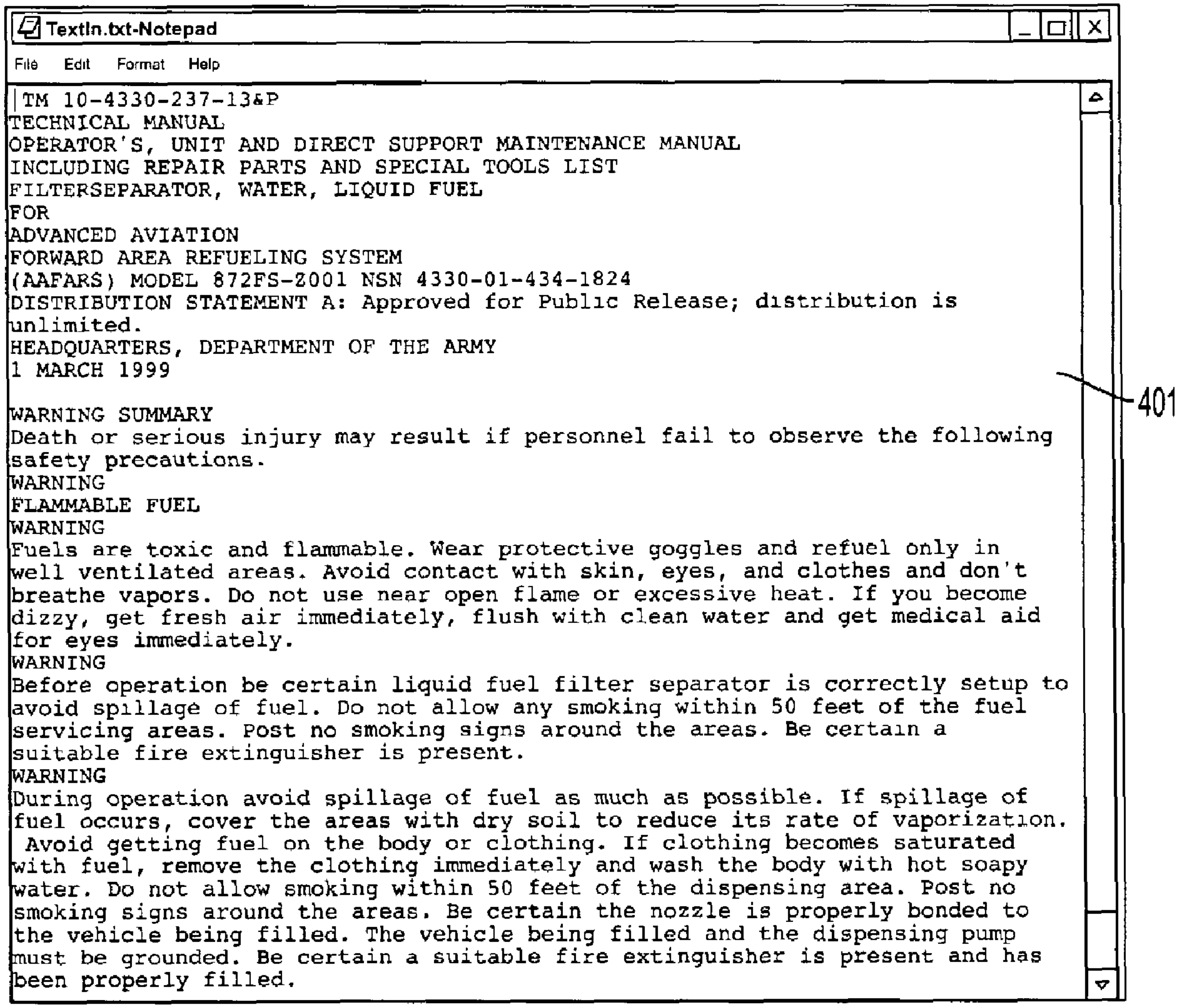
FIG. 5 shows a computer screen display of raw ASCII text from a first embodiment of conversion software to generate interactive electronic reference materials from non-interactive reference materials.

FIG. 5 provides for an embodiment showing a screen of text converted from a scanned document which is part of a paper manual which has been converted to ASCII plain text (401). The text only includes minimal formatting with line feed carriage return characters to delimit paragraphs, titles, or other areas which are clearly separated from each other. If tabular text has been included in this portion of the scanning, cells within tables may be separated by tabs, and table rows may be separated by line feed carriage returns. The text lacks formatting such as underlining or indenting.

This plain text file comprises the raw text (401) from the manual. If the original scanned document (or computer format document) included pictorial text, it will be separated out in this embodiment and saved as a graphical file (in step (107)) which will be used as discussed later. The scanned text of FIG. 5 may be verified for correctness in step (105). For example, a human operator can make sure that the text was correctly recognized and that each symbol in the text has been correctly understood by the recognition software. That is "I" and "1" and other similar terms were correctly interpreted. In other embodiments, this step may be unnecessary.

Figure 6:
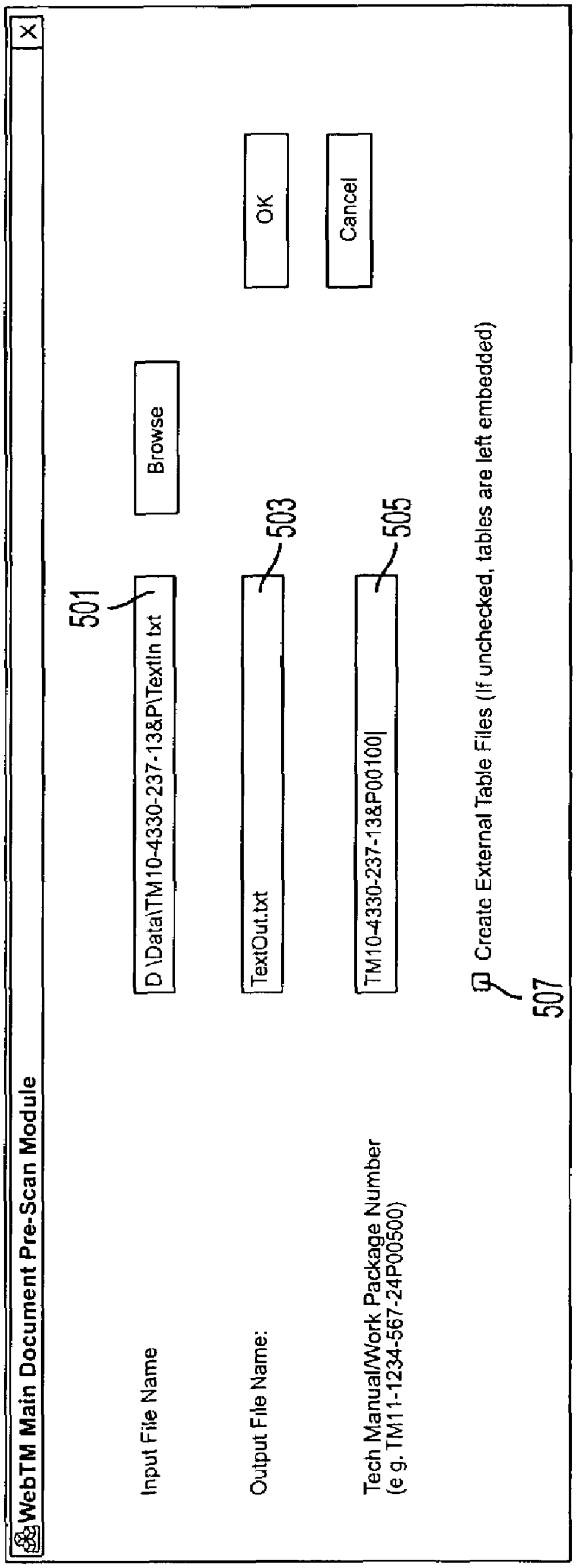
FIG. 6 shows a computer screen display of a menu for identifying and tagging the ASCII text of FIG. 5 from the first embodiment of conversion software.

Once the initial creation of the raw text file has been completed, the ASCII text will be pre-scanned utilizing pre-scan software as discussed in step (111). An example of the screen to begin pre-scanning is shown in FIG. 6. In this step, the ASCII text file created in the previous step is inputted into window (501) and an output file is designated (503). There may also be a block for the entry (505) of the particular manual that this text is from. This block (505) may allow for the use of certain global parameters based on the type of work this manual is or simply to provide a label to associate the raw text to a particular reference document. Most military manuals (and other manuals across a trade) utilize a generally similar format. Therefore, by entering a document identifier, the system in an embodiment, can recognize what type of manual the ASCII text is from. Therefore, in an embodiment, it can load a global set of parameters specific to that type of manual so that it formats the manual in the appropriate fashion. The global parameters may provide for indications of how to identify reference text of a particular type (e.g. some documents may say "figure" while others say "fig.") and/or may provide for indications of formatting style. One of ordinary skill in the art would understand that these global parameters could be based on the type of technical manual, the branch of service the manual is from (for instance army, navy, or air force) or any other selectable criteria.

The pre-scan module now scans the ASCII text file searching for particular patterns, tables, references, steps, paragraphs, figures or even words such as "maintenance" or "figure" that would indicate a particular pattern of text, indicating a particular format of text would be appropriate for that text or reference text is present. Reference documents used by the military and/or other organizations are generally supposed to have a common style so as to be easily understood by one familiar with the format, even if they are not familiar with the device the reference document describes. For instance, a chapter heading in a particular document is potentially supposed be formatted in bold 14 point text. The pre-scan is looking for a particular pattern of raw text (for instance a single sentence, having all words capitalized, and followed by a hard return, and then another paragraph), that comprises text which is probably a title to indicate that it is supposed to be a 14 point title (bold text).

The pre-scan is therefore identifying and inserting into the raw text tags about format and/or type of text. Each piece of reference text will generally be tagged to indicate the type of reference text it is and what its value is (where the value is essentially the text itself) while other tags can indicate formatting such as text is a "title" or is even directly "bold." In example, from locating text which includes "FIG. 1," the "FIG. 1" may be determined to be reference text to a particular figure drawing with the value of "FIG. 1."

Tables may be either embedded within the prose disclosure text or may be removed to a separate file by checking or unchecking box (507). Formula items identified as out-lines, tables of contents, multi-level numbered lists, or other tabular text could be appropriately laid out and labeled. Further tables can be quickly identified so that relevant related text located in the tabular text format can be maintained. It is important to remember here that this original pre-scan is being performed by a machine in this embodiment, and therefore the tags can be either an instruction understandable to the machine (e.g. make the following text bold) or may be an indication a machine understands to go somewhere else to look up a meaning (e.g. this text is a title). This is most easily thought of in HTML, and in an embodiment the tags are HTML tags. In HTML programming, a tag indicates to do something (e.g. <bold> indicates to make everything following the tag bold until an instruction to stop making things bold is received). In a similar fashion the tag "#FR:" while not an HTML command, can reference to the machine to make what follows a hyperlink to something labeled "#figure:" so long as what follows the colon in both cases is the same.

FIG. 7 provides for the same text as FIG. 5, after it has passed through the pre-scan of FIG. 6. It is apparent that there is now additional formatting present and some machine tags are visible. In addition to the clear indenting of the multi-level list (601) (essentially formatting tags recognized by the text display used in FIG. 7), there are also some tags visible. Tag (603) of 3 pound signs in a row (###) indicates the end of a table, tag (605) of "#FIGURE:" identifies that there is reference text here with value "FIG. 1-1." Further, tag (607) of "#FR:" indicates reference text tagged as a figure reference to a value "FIG. 1-2." In FIG. 6, the index numbers (e.g. "(6)") are not tagged yet. In another embodiment, they could have been.

The inclusion of tags in the text allows for the later recognition by the final scan that a certain piece of text is to be placed in a particular format and/or treated in a particular way. For instance the #FR reference will become a link to the particular figure whose value occurs after the tag. For instance, this may be tagged "#FIGURE: FIG. 1-2" or simply the figure referenced by the document file name in brackets. This file name may have been previously generated for use in the tagging or could be of a standard format to refer to a particular figure of a particular matter.

What should be clear from FIG. 7 is that each piece of reference text now comprises two things. It has a tag (e.g. #FR) which will be understood by the machine as an instruction to utilize a certain function during conversion, and the value (e.g. FIG. 1-2). These two items therefore define the interlinking. In particular, all occurrences of "#FR:FIG. 1-2" mean the same thing as those references are the same whereas if either part is different, the reference text is different. In this way, a predetermined number of instructions, can be combined with any number of actual pieces of reference text to always create a discrete matrix of possible outcomes. One of ordinary skill in the art would understand that referencing the same thing does not mean they are the "same" tag/value combination, e.g. "#FR:FIG. 1-1" and "#Figure:FIG. 1-1"both refer to the same figure, but use different tags to provide different results in the later linking. For example, #FR could link to #figure, but #figure may not link to #FR but may link to a different piece of reference text also associated with that figure.

In addition to tagging pieces of reference text within the prose text, text in tabular text can also be tagged. This may occur through the processes discussed above in conjunction with the general formatting (e.g. the first column of a table is generally the reference that is used as it is the most easily located in a paper table, so the machine could recognize a table, the type of table based on its layout and label the first column in the appropriate manner). Alternatively, the tables may be treated separately. Generally, because tabular text is arranged so interrelationships are visually clear, it is generally easy to instruct a machine, once the type of table is known, how to label any reference text within the entries. For example, each cell in the first column could provide a value for a piece of reference text with all cells having the same type of tag.

Figure 8:
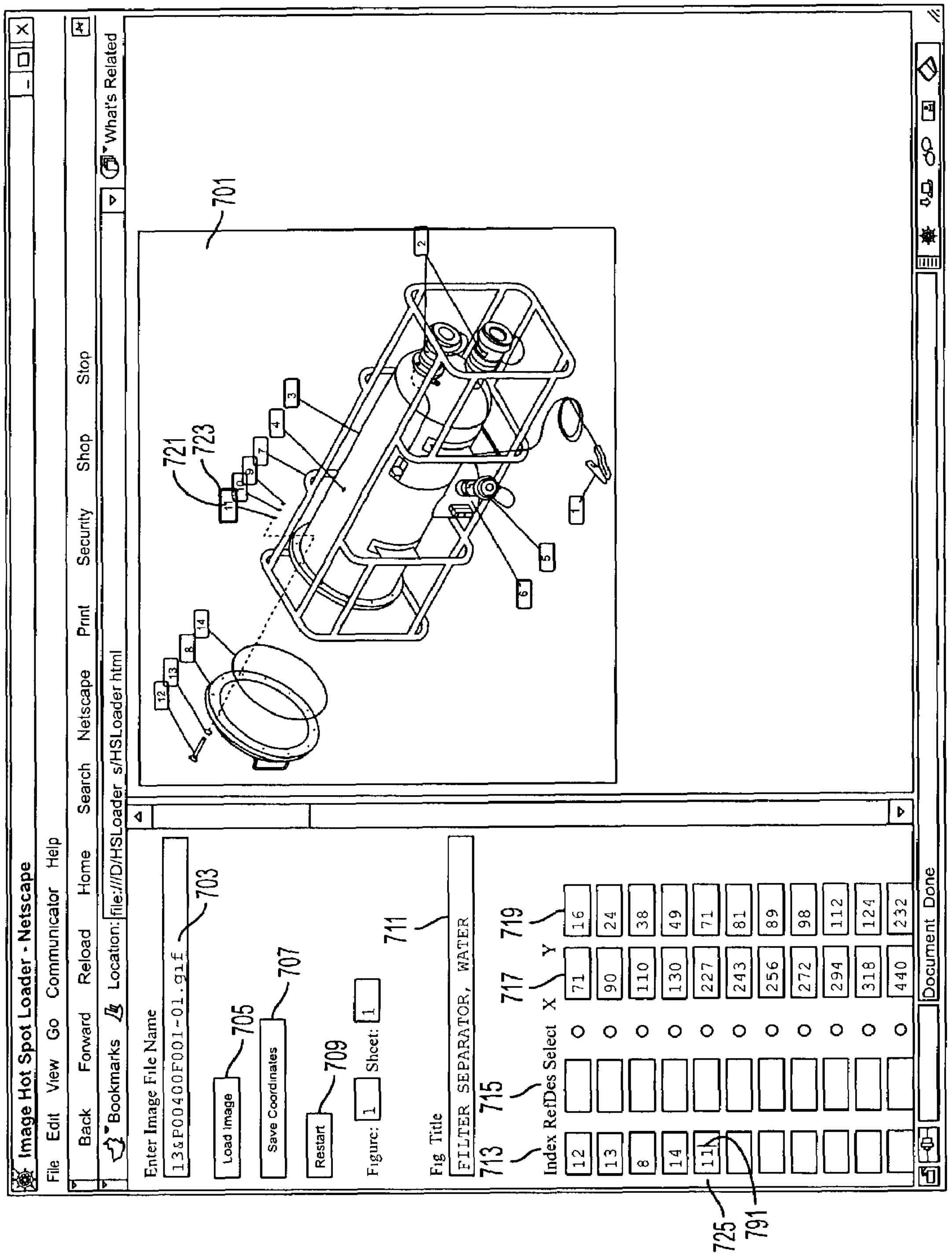
FIG. 8 shows an embodiment of a computer screen display of a hot-spotting interface from the first embodiment of conversion software.

Once the prose text has been tagged, there is still the need for the pictorial text to be tagged. FIG. 8 shows the first step of figure formatting which is called "hot-spotting." While the step (117) of hot-spotting is shown in FIG. 3 as occurring after the textual pre-scan and review, one of ordinary skill in the art would recognize that these are actually separate operations and therefore could be performed in any order. Hot-spotting allows for a link to a particular index number (piece of reference text) in a figure (701) from the reference material to be linked to the location of that index number in the drawing. In particular, it is particularly useful for the system to know that the reference for the part labeled "1" in a certain drawings is at a certain X/Y coordinate in the pictorial presentation.

The hot-spotting module provides for a slight variation on the textual pre-scan. In the pre-scan the machine determined, based on the general parameters, what was reference text and what tag was appropriate for a particular type of reference text. In particular, was the reference text referring to a figure as a whole, an index number within a figure, another page or section in the text, etc. This was accomplished by the "look" of the text. In a figure, it is generally known that all reference text within the figure comprises figure index or reference numbers. Therefore, the hot-spotting allows the user to associate a particular value of the index or reference number to a particular location corresponding to the location of the reference number in the figure. In this way with knowledge of the value of the index number, that index number can be quickly located and highlighted in a figure.

The particulars of hot-spotting can be described in conjunction with FIG. 8. The graphical figure (701) being hot-spotted is shown on the right hand side of FIG. 8. On the left hand side of FIG. 8 are the image file name (703) as well as buttons to load (705), save (707) and restart (709) work on figure (701), and a box to enter the title of a figure (711). There are also columns of index numbers (713), reference designation (715) and X and Y coordinates (717) and (719) in a tabular form. The buttons (705), (707), and (709) are relatively self-explanatory with the capability of loading, saving or restarting work on figure (701). The title entry is also self explanatory allowing the operator to enter a title for figure (701) (this may be a display title and/or may provide for linking to the figure by figure number, etc.).

The tabular column entries (713), (715), (717), and (719) provide for the entry of index numbers (values) and the association of those index numbers with particular locations in the figure. In many reference materials, figures are labeled with index numbers that allow the reference of a particular drawing of a part to a textual description associated with that part. The columns allow for a computer association between the index number and a location of the index number within the figure.

In operation, the hot-spotting module is generally used as follows. Either a human operator can examine the figure (701) and go through and click on each index number, or the computer can scan through the figure (701) locating the numbers itself and highlighting them. As each number (for instance index number "11" (721)) is located or clicked, the computer places the X/Y coordinate of that point in a row of the X and Y columns (717) and (719) as shown. It then also places a box (723) of predetermined size around that point to indicate the reference location it has assigned based to that X/Y coordinate and therefore that row. Once all the index references have been identified, the operator can go through them, or the machine can automatically go through them, and enter the index number corresponding to that box (723) (basically the number in that box) into the correct row. Generally, when a row (725) corresponding to a particular X/Y coordinate includes the cursor (791), the box (723) at the coordinates in that row is highlighted. As can be seen from FIG. 8, the cursor (791) is in row (725). Therefore the box (723) is highlighted in the figure (701). In this way, an operator can see which box corresponds to which row and enter the appropriate index (in this case "11") into the row (725).

In some figures, there may alternatively or additionally be a reference designation associated with a particular part. A reference designation is particularly appropriate when figure (701) is a schematic of an electronic system (e.g. a circuit diagram). There may be a resistor shown with index "11" but that is also indicated to be "R100." This reference designation could provide additional information about the part indicated by the reference number (for instance its resistance) or may provide a universal lookup for similar parts (e.g. there could be two resistors each shown with its own unique index number because they are in different places on the circuit board but both having the same reference number because they are interchangeable parts).

Once all values of the index and/or reference numbers have been entered in columns (713) and/or (715), there exists a map file indicating the connection between various index number's values, the locations of these index numbers in the various figures and therefore the indexed part, and any reference number associated with that part. This map file is stored and will be used for interactive linking as is discussed later.

Military manuals often include a combined parts list or similar tabular document with all the index and/or reference numbers used in the reference materials tabulated with the associated part identification information. This is essentially a part glossary having index numbers associated with parts numbers and other information about the part. In military manuals it is often called a Repair Parts Special Tools List (RPSTL) or an Illustrated Parts Breakdown (IPB). These are essentially the same for the purposes of this disclosure.

This parts list, which is generally a table, may also be extracted and edited in the same manner as the prose text (see FIGS. 5 through 7 and the associated discussion). However, because a parts list is generally only a table, it is preferable that the text be extracted into a spreadsheet or similar computer system instead of as a pure text document. Such a parts list is extracted in this embodiment into a Microsoft® Excel® spreadsheet as shown in FIG. 9. The tagging can then relate to indications that values in particular columns correspond to different types of instructions. In this case, column C (801) is the column which has the index numbers so the text in column C (801) is reference text. Other columns can also include reference text such as column D (803) which has the part number. Once the reference text has been identified, the file is saved. One of ordinary skill in the art would recognize that the tagging of reference text in this type of document can be simplified as the tagging can essentially be accomplished by simple recognition of which column (or row) contains reference text entries of a particular type.

As can be seen, by this point in the steps of FIG. 3 there are three files existing which have been created. Each of these files includes identified reference text indicated by tags and values. There is a tagged prose file (created by step (115)), a map file (created by step (121), and a parts list spreadsheet (tabular file) (created by step (125)). In addition to the reference text, each file also includes a selection of disclosure associated with that reference text which is unique to that file.

In the next steps of FIG. 3, these three files are now combined in various patterns to provide for interactive reference materials. In this particular embodiment, two types of interactive manuals are formed but any type of interlinking between any combination of two or more documents may be carried out in another embodiment of the invention. The first of the interactive reference documents formed in this embodiment is an interactive parts list. To form an interactive parts list, the map list information and the parts list spreadsheet are combined to provide for interlinking between related reference text. At the same time, both the figures and the parts list spreadsheet information are converted into a browser readable format. This may be by converting the information into computer code such as HTML, XML, JavaScript, or other computer code. In the preferred embodiment, this step is done automatically by a computer. In other embodiments, files can be combined in a different order and/or with human assistance.

As was discussed previously, each file includes reference text comprising index numbers tagged as such and indicating the value. Each file also has information associated with the index number value which the other file does not (one has part information, and the other has the index value's location in pictorial text). The files are converted into a particular browser readable code which links each of the related tag/value pairs together. For instance, on each figure, the coordinates previously selected (and in fact all the coordinates in the box (723)) can be turned into a graphical hyperlink within the figure at that point so that clicking in box (723) (clicking on the index number) links to the row of the parts list spreadsheet associated with the index number assigned to that box. One could also provide a hyperlink the opposite direction. This type of linking can be part of why different tags are used for similar references. The machine can know to convert #FR(value) to connect to #figure(value) and #figure(value) to #FR(value).

In this way, if a user were to click on the part's reference number in a figure the screen (or a portion of the screen) would be instantly taken to the row in the parts list showing what that part is and providing the part list information associated with it. In the same way, and individual looking at the parts list, could click a parts index number they needed more information about and be taken to a figure showing that part with that part's index number already highlighted in a box to show where that part is used in context.

Figure 10:
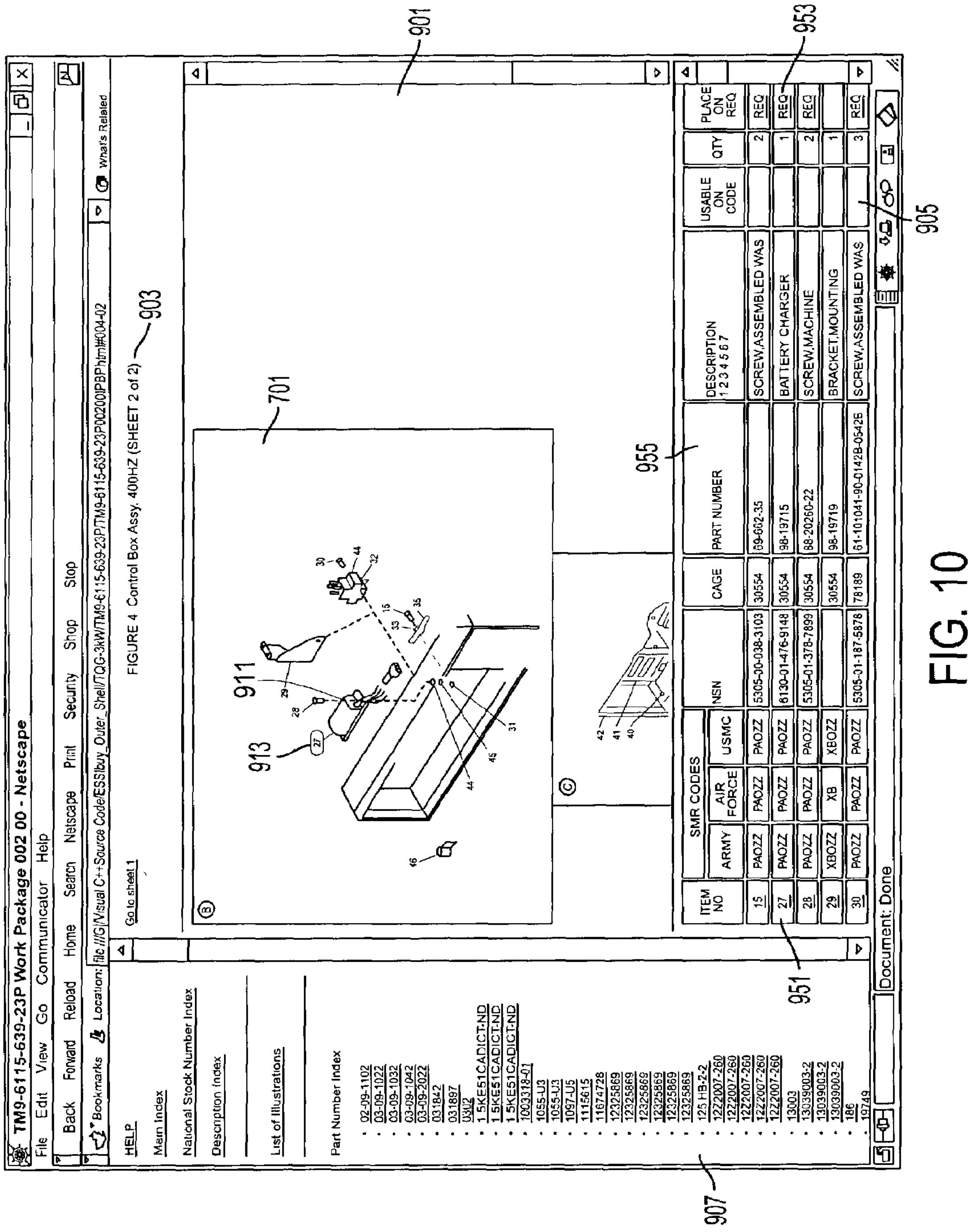
FIG. 10 shows an embodiment of a computer screen display of a interactive parts list generated by the first embodiment of conversion software.

FIG. 10 shows a screenshot of an embodiment of how a parts list and a figure can appear and operate when so interlinked. That is, FIG. 10 shows an embodiment of an interactive parts list which is a specialized form of an interactive item list where various items associated with a particular device are displayed. In the browser display of FIG. 10, frames are used so that the two component files are referenced, stored, and displayed separately. One of ordinary skill in the art would understand, however, that in another embodiment, frames are not necessary. In the top window (901), there is a diagram of the figure (701) as seen previously. In this figure, the reference numbers are visible and the figure now includes a title (903) which may correspond to the title entered for the figure back in the hot-spotting page (FIG. 7) in title box (711) (this was formatted as a figure title when the conversion occurred). If a user has taken the object shown in FIG. 10 apart and determined that piece (911) indicated by internal reference "27" is broken, he need only look at the picture and click on the index number (913) in picture (701). In the bottom window (905) there is then visible a parts list (955) which has now jumped to item number "27" as indicated by row (951) of the parts list (955). This listing provides the full parts listing of the part associated with that reference number in a format designed for ease of use after it was formatted in the conversion step above. As a component of this parts list (955), in an embodiment there may also be a method for ordering the part, as generally indicated by requisition link (953), but that will be discussed later.

Further on FIG. 10 there is in side window (907) which is yet an additional frame and in which there is provided an abbreviated parts number list. This list demonstrates an internal linking within the parts list and may be created from the information in the parts list. In particular, the parts numbers can be extracted from the list (as they are all in a column) into another file and they can then be treated as reference text when assigning the values in the extracted column and the tabular text of the parts list. The parts numbers in the extracted column can then be organized in a different order from the data in the parts list (e.g. in a parts' number order) as shown. If a user were to find a part and be unsure of what it is for, they could look up the part number on this list, click on the part, and immediately be taken to a screen showing the part list (955) in lower window (905). They could then click on the index number associated with that part in parts list (955) and be provided with the figure showing the part's placement as in figure (701). In this way, the various components have been effectively linked together and the single parts list and figure references have been converted into a useful interactive document.

The parts number list in the side window (907) shows another embodiment of how the links can be created. As should be apparent from FIG. 10, the side window (907) links to the parts list spreadsheet (955), but the alternative is not the case. This is because a user would be highly unlikely to need to access a parts number index from the parts list (as the number list provides no useful additional disclosure). Therefore these links are only made one way for simplicity.

One of ordinary skill in the art would understand that FIG. 10 provides simply one embodiment of how a screen could appear to a user trying to locate parts information and use an interactive parts list. In another embodiment, the screen could be laid out entirely differently. For instance, instead of using multiple frames, the hyperlinks could simply lead through to entirely new windows. In still another embodiment, different information could be used to link. For instance, in an embodiment, instead of a parts list in the side window, a parts description could be included so that if a user knows they are looking for a gasket, they can look up all the gaskets to try and determine which one they want. This leads to the general recognition that virtually any piece of text could be a piece of reference text to provide interlinking. While certain text is more clearly intended to be reference text under most circumstances, particularly when specific indexes or "tables of contents" are created, any appropriate text could be used as reference text in other embodiments. The only thing that is necessary is for the general parameters of the pre-scan to recognize that such a piece of text is intended to be a piece of reference text in the document and to tag it appropriately.

One of ordinary skill in the art would understand from the above discussion that interactive reference materials allow the user to cross-reference different materials by using the references they share, even if those references require an intermediate source to understand. That is, so long as a logical chain can be drawn between the various materials, the user can follow that chain to find what they are looking for so long as that link had been recognized when the interactive reference materials were made.

Figure 11:
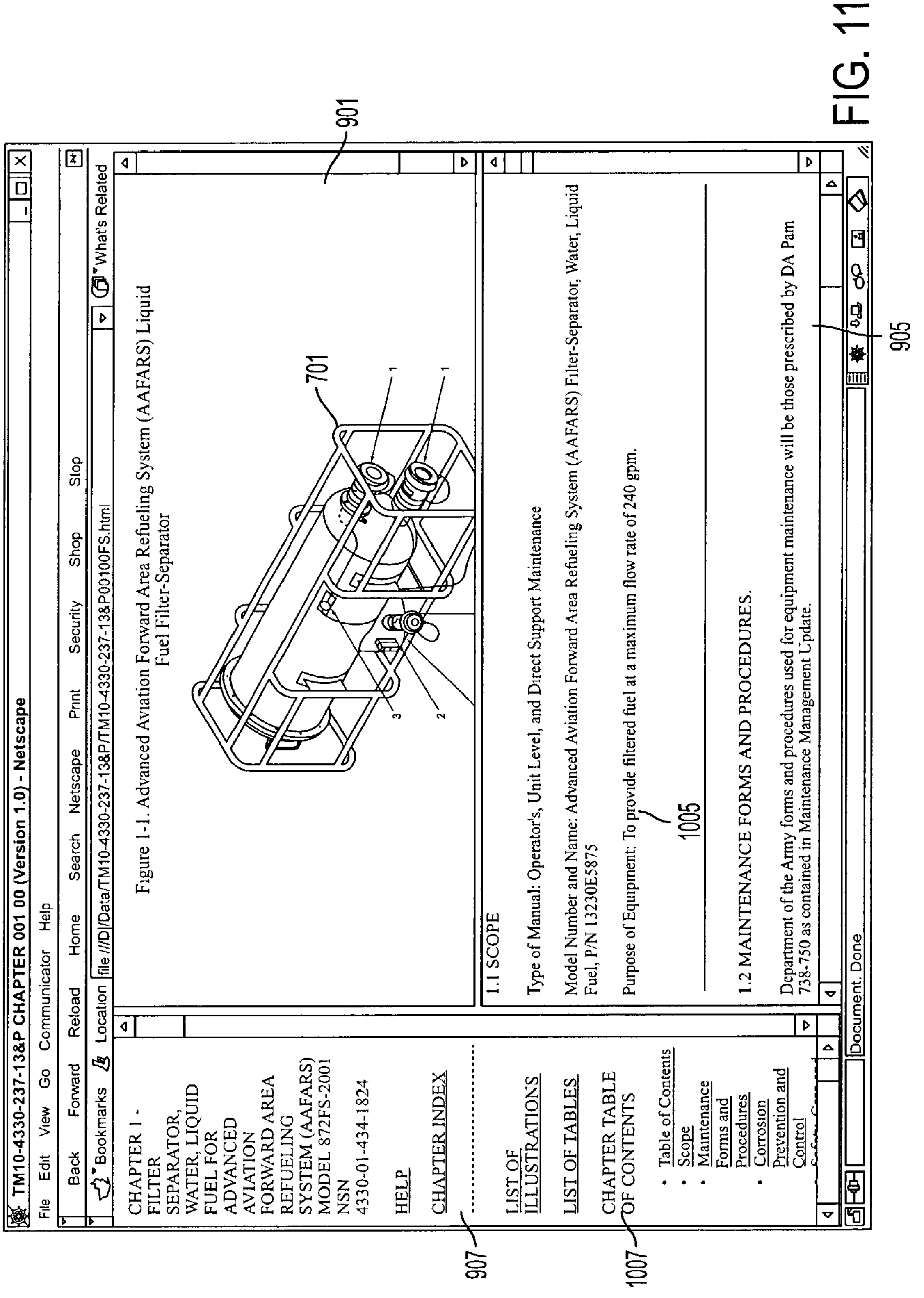
FIG. 11 shows an embodiment of a computer screen display of an interactive manual generated by the first embodiment of conversion software.

The interactive parts list of FIG. 10 in and of itself is useful for providing links of the parts list to the individual figures. However, using the logical chain principle from above, other materials can be combined therewith. In particular, the prose text of the reference material has not yet been utilized. The file of tagged prose text created in step (115) may now be linked with the figures (701) and/or the parts list (955) to provide for yet another interactive reference. In the described embodiment, the prose text is linked to the already existing interactive parts list to form an interactive manual and parts list. The conversion process is essentially the same as for creating the interactive parts list of FIG. 10, except that now there are more tag/value combinations. Essentially, in the creation of the interactive parts list (955) the reference text was primarily part index numbers. Inclusion of the prose text simply provides for more types of reference text types and generally more formatting tags. An embodiment of the interactive manual and parts list, including prose text, after conversion into HTML is shown in FIG. 11. One of skill in the art can see from FIG. 11 that the prose text has also been formatted through the tags originally placed in the file as part of the conversion into browser readable format in step (133), so as to provide a nice screen appearance.

In FIG. 1, a user has a maintenance manual (prose text) (1005) available in the lower window (905) which they can read and scroll through as they are performing maintenance in the standard manner. However, they can now interactively search this manual as a table of contents (1007) has been created in the side window (902) (in much the same way as the parts number list was created). This table of contents can also be included within the lower window (905) prose text as well in another embodiment. The table of contents allows the user to quickly jump to a section of the manual that they wish to read. Further, a figure (701) associated with the particular portion of the manual they are reading is also available on the screen. This figure can be made available because the user clicked on a figure number reference, or because the table of contents is associated to both the prose text and the related figure (e.g. clicking on a particular table of contents entry loads both a text and a picture file) or because a page of prose text (1005) is linked to a particular figure (e.g. by page number) where the figure originally appeared. In the latter embodiment above, the interlinking may be made by breaking the prose text into discrete chunks each of which are associated with a figure or through any other method known to those of ordinary skill in the art.

Figure 12:
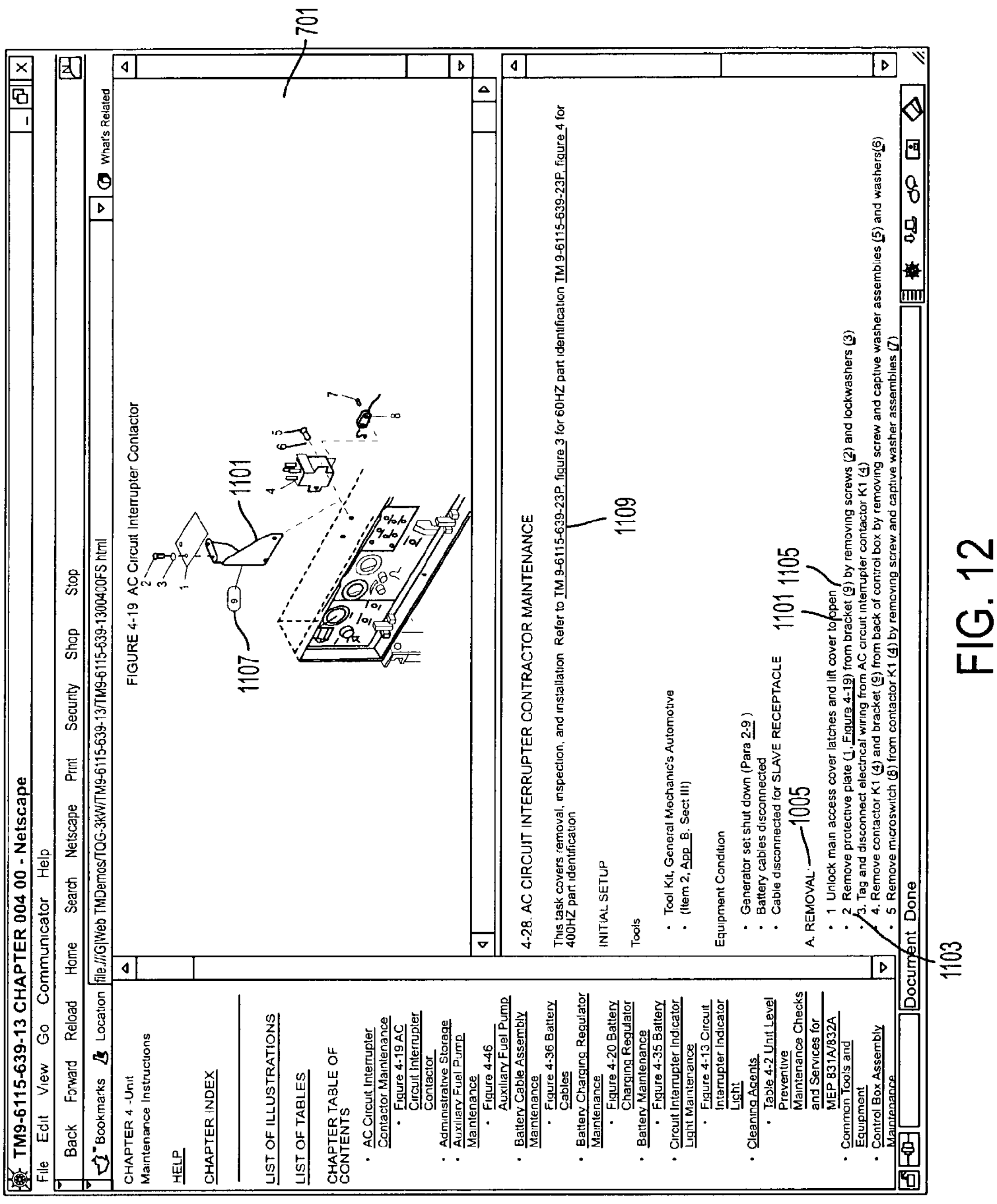
FIG. 12 shows another embodiment of a computer screen display of an interactive manual generated by a first embodiment of conversion software specifically showing interactivity between prose text and pictorial text.

The figure presented can always be the appropriate figure for the prose text being read. If the user was to select a particular index reference from the prose text, they can be taken to the figure (either the one currently present or a particular one depending on how the system is set up) showing the location of the particular part with that index value. This is shown in FIG. 12, in FIG. 12 the user is reading about how to remove an AC circuit interrupter in prose text (1005). In reading the instructions they may have need to locate the bracket "9" (1101) they are supposed to remove based on instruction (1103). If they were to click on the brackets reference "9" (1105) in the prose text of the manual, they have highlighted the index number "9" (1107) indicating the correct bracket (1101) in the figure (701). In yet another embodiment, the figure (701) may be linked with a legend which is not visible. This legend could be linked up with the figure so that hovering a pointer or other device over the figure reference in figure (701) provides for a pop-up window or similar structure showing the name of that particular piece ("bracket" in this case).

While this interactive manual is useful on its own, the interactive manual in this embodiment can also be interlinked to the interactive parts list previously discussed in conjunction with FIG. 10. Therefore if a user of FIG. 12 still required additional information, or wished to determine the part number of bracket "9" (1101) (for instance because it was broken and a new one needed to be ordered) the user, in one embodiment, could go up to the figure and click on the index number "9" (1107). This would then allow for the manual (1005) in the lower window (905) to be replaced with parts list information as shown in FIG. 10 using the interlinking already described in conjunction with FIG. 10.

In another embodiment, links to the parts list may be included in the prose text such as through link (1109). This link can be created by recognizing that the name of the parts list may be reference text. This latter embodiment may be preferable in the cases of certain manuals because the pictures associated with the prose text, may not be the same as those in the parts list. In the latter embodiment, therefore, clicking on the parts list link (1109) may result in not only the prose text (1005) being swapped to the parts list (955), but for the figure (701) to also change into a related figure which is better for use with the parts list (955). This arrangement may be used in an embodiment to accept changes due to standards usually used in reference manuals. For instance, in some branches of service, different figures are used in parts lists than in manuals so that the manual does not need to be updated if the parts list is updated.

From the interaction of FIGS. 10 through 12, the capability of an interactive reference system can be seen. In the depicted embodiment, the reference materials comprised related manuals, but one of ordinary skill in the art would understand how the general principles of creating interlinked documents above could be used to provide for interlinking of any number of different reference materials and parts of individual reference documents. In this way, a user trying to carry out an instruction in any manual can load the manual and then call up detailed pictures associated with any particular reference even if they were originally in a different manual or even for a different device. From a picture, they can call up detailed information about a part. In another embodiment, from a maintenance manual they could load a repair manual. The possibilities are virtually limitless. A user could also go in different direction for instance in another embodiment a user with an unknown part they can determine what system the part is from, and then load a manual showing how to install or repair the part.

Through the use of the network architecture discussed in FIGS. 4A and 4B, these manuals, in an embodiment, are available to any user having access to a client and being allowed to access the server on which the reference materials are resident. In the case of the military, the reference materials may be placed on a secured server, or on certain redundant servers and any person (e.g. soldier) which may need the manuals can be provided with a client to access the network and one or more of these servers. This user therefore need only carry the client to have access to all the paper manuals they originally carried.

The use of the client/server network architecture also provides security benefits. One of ordinary skill in the art would understand that since the interactive reference system is stored electronically, the system could be placed on storage media and given to the individual user in an alternative embodiment (who then would not need access to the network or provided via a network). Access to the reference materials could require passing of various security measures which can help to prevent the materials from falling into the wrong hands. Further, data destruction in the event of possible capture can be performed easier as the user has few or no documents to destroy and a server operator (who can be thousands of miles away) may be able to eliminate the access before the security can be broken even if the client is captured.

The above system utilizing HTML conversion and relating of reference text comprises only a single embodiment of the general system and method of FIG. 1 for creating interactive reference materials. In another embodiment, the simple relationships can be made far more powerful through the use of a set of global controls which provide for an overview set of universal instructions for the conversion of reference materials.

A second embodiment of conversion software is discussed in conjunction with FIGS. 13-19 and is designed to learn so that the more documents that are available in the interactive reference system, the easier it is to convert new reference material into interactive reference material. In particular, this system, instead of assigning particular tags to a particular piece of reference text which is then matched to a related piece of reference text, utilizes a macro global control where commands can be nested within a document based on a global control set. In this way, any number of tagged reference documents can be simultaneously linked together through the use of nested commands so long as they use the same global control. It is preferable that this embodiment be encoded using XML or Standard Generalized Markup Language (SGML) as such nesting of commands within global controls is efficient in these languages, but other languages may be used as understood by those of ordinary skill in the art. This discussion will presume that XML is being used to program the depicted embodiment.

Figure 13:
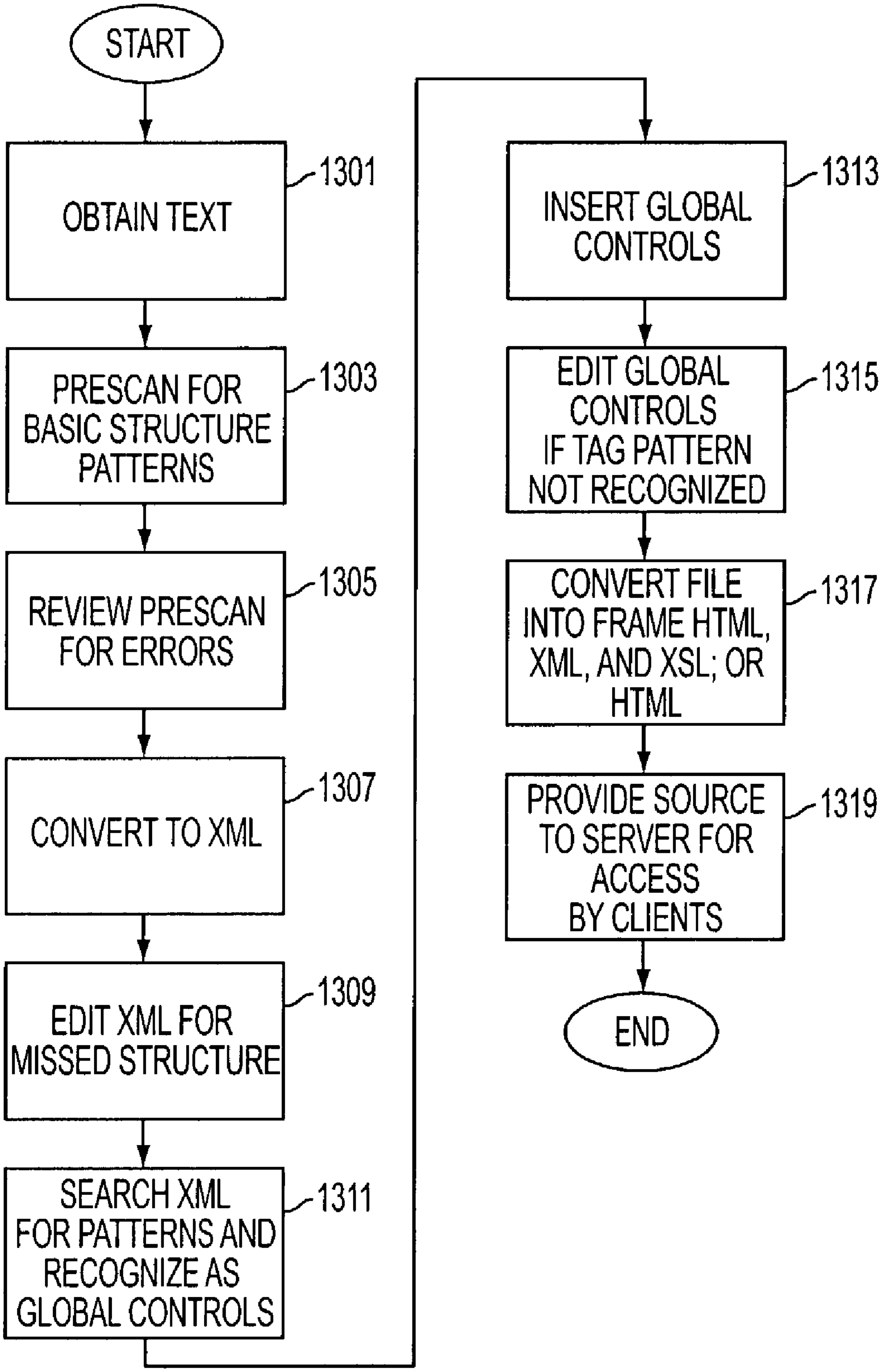
FIG. 13 provides a flowchart of the operation of computer conversion software to convert non-interactive reference materials to interactive reference materials of a second embodiment.

FIG. 1 still provides the general steps of the operation, but FIG. 13 shows how this second embodiment uses slightly different steps from the embodiment of FIG. 3. FIG. 13 only discusses the conversion of prose text reference materials. From FIG. 3 and the associated discussion, tagging of other types of disclosure text in this second embodiment are essentially the same as in the first embodiment except tags use XML and global controls as in the prose text case described here. In step (1301) the text is obtained in a similar manner to step (101) of FIG. 3 in a computer readable form. In FIG. 13, the text may however be original XML source text including XML tags which are maintained in the conversion. Many military reference materials being created currently are created in XML using a predefined set of styles or Document Type Definitions (DTDs) defined by the branch of the military. Documents created in this form may bypass steps (1301), (1303), (1305), (1307), and (1309) of this embodiment. In step (1303) the text is tagged in XML during the pre-scan which locates basic structure patterns such as formatting and reference text and includes tags for formatting and apparent reference text in the same manner as the first embodiment. The resulting file is then reviewed for errors (1305), if desired, generally in an embodiment by a human operator examining the file. In step (1307) text to XML conversion software is run on the output of step (1305). This places the formatting previously identified into XML form. The XML text is again reviewed and possibly edited in step (1309). In this review step, an editor is primarily looking for XML which does not have sufficient detail. For example, a paragraph may have been labeled as a simple paragraph (e.g. <para>) when it was actually a particular type of paragraph, but that was not identified by the XML conversion step. In step (1311), the XML file is searched for combinations (or parent/child relationships) of tags which are compared to the global control, which in this embodiment is a database and/or DTD to locate and identify patterns. This lookup is essentially a conversion of a certain string of XML tags into a particular type of tag recognized by the global control either for formatting, reference indication, or both and is represented by step (1313). As discussed, the commands can be nested or parent/child related, therefore the commands "bold," "underline," and "14pt font" applying to the same text can actually be represented by the global control "title" if this title also is identified as reference text those commands may be further nested. If all titles are reference text the formatting and reference tag may be the same. Any unrecognized patterns can also be identified and a human or machine intelligence can be used to classify them in step (1315).

Once all information about the references is in the global control, the materials can be interlinked and made interactive using the global control and converted into browser readable format (1317). As a by product an XML, an XSL style sheet can be created directly from the global control in this step. Further, the conversion in this case can be lessened as much of the conversion can be passed to the client to be performed on receipt. As one of ordinary skill in the art would understand, because the global control is used by multiple references, the documents can be interlinked "on the fly" when provided to the user in step (1319). Also, the linking may again be checked (as in step (135)) in this embodiment although that step is not shown.

Figure 14:
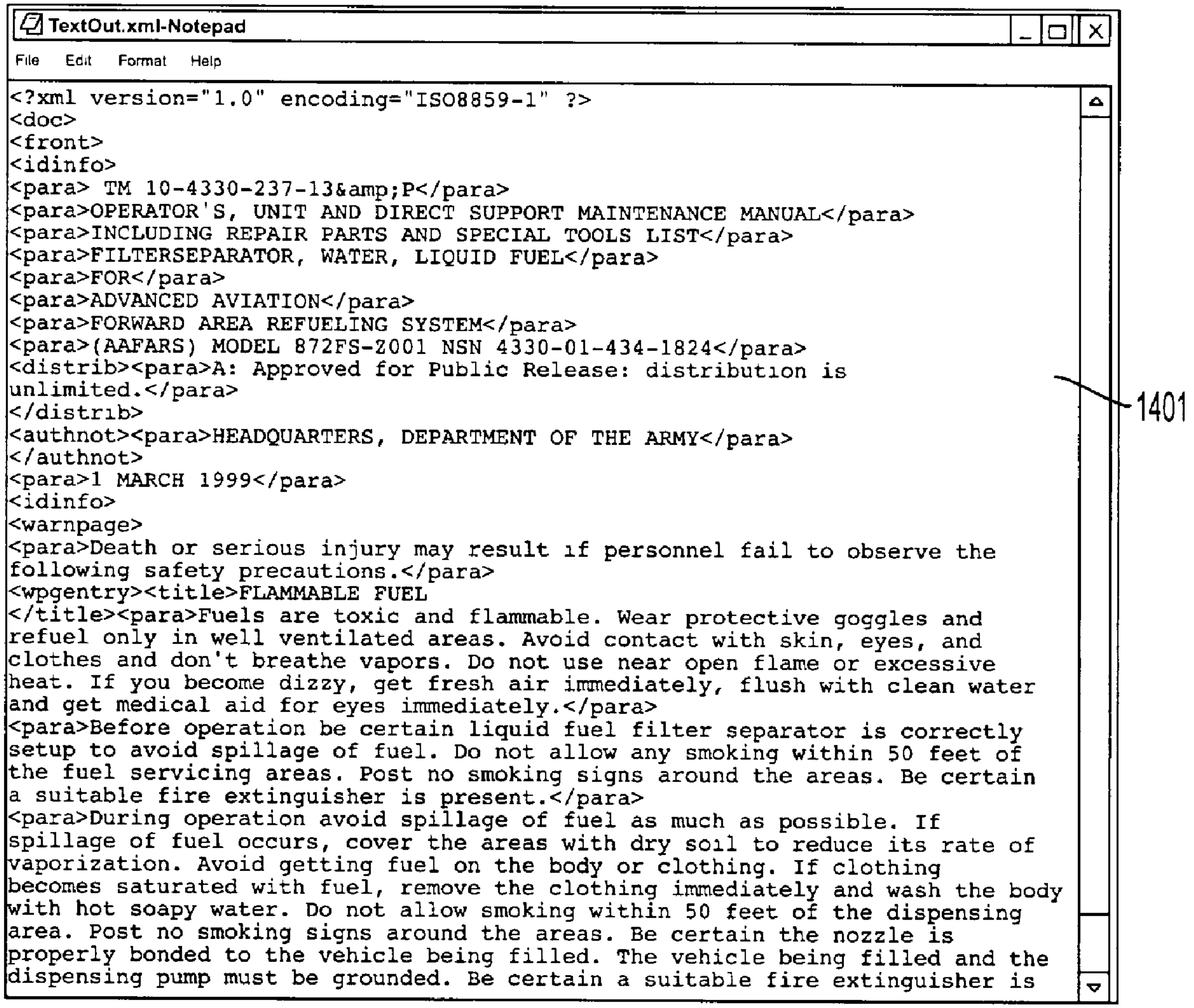
FIG. 14 shows an embodiment of a computer screen display of XML text after initial scanning from the second embodiment of conversion software.
Figure 15:
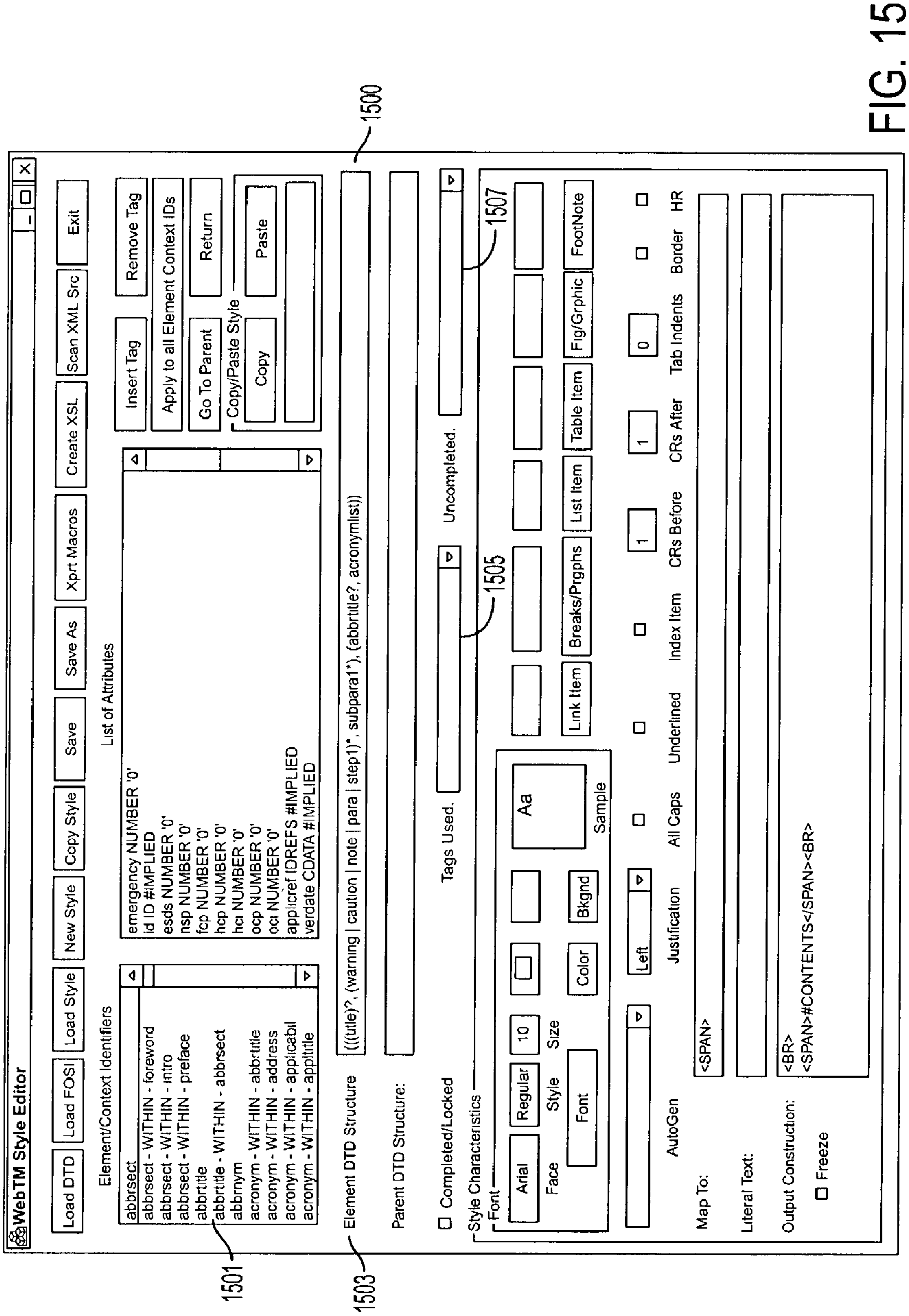
FIG. 15 shows an embodiment of a computer screen display of a mapping construction module from the second embodiment of conversion software.
Figure 16:
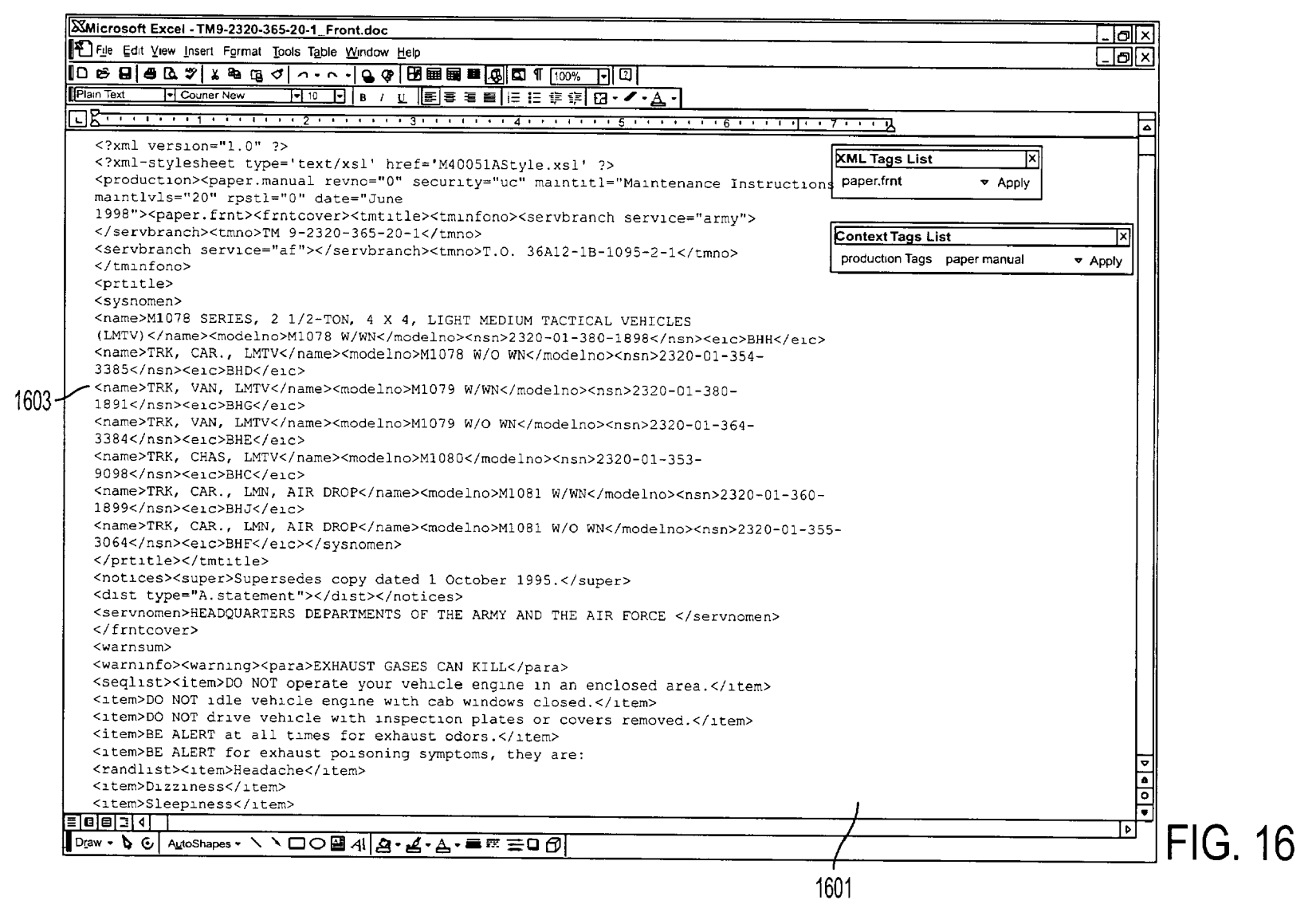
FIG. 16 shows an embodiment of a computer screen display of a manual editing module from the second embodiment of conversion software.

FIGS. 14-19 show how a reference document can be converted into an interactive document utilizing an XML-based DTD global control. In FIG. 14 there is provided a screen of text (1401) which has been placed in a computer readable form and has been formatted in accordance with XML principles as described in steps (1301) through (1309) of FIG. 13. This text (1401) is then loaded into a mapping construction module (1500) such as that shown in FIG. 15. The mapping construction module (1401) has loaded therein an existing set of global controls. These are identified in identification box (1501) showing the type of thing the text is intended to be. This global control will generally have begun with structures from a US military defined structure which is supposed to be followed by the particular document. In an embodiment, the global control may be based on a DTD which may be a military DTD or any other DTD as known to those of ordinary skill in the art which show a general intended format for documents of a particular type. In the military context, DTDs which may be used in an embodiment of the invention to create the initial global control specifically include, but are not limited to, Army 2361A, Air Force 38784, and Navy 3001. There is also shown a structure (in XML/HTML tag format) associated with that particular tag in structure box (1503). When the mapping construction module (1500) is run, the patterns in the XML tags of FIG. 14 corresponding to these particular global controls are identified and replaced. The tags used box (1505) identifies which were used. The uncompleted box (1507) then provides for a listing of all unrecognized patterns. This may be because an incorrect pattern was used in setting up the XML, or because a new pattern, not previously defined, exists in the document. If there are undefined patterns, they may be added or reviewed by a human operator using an editing program or electronically identified. An embodiment of a human editing program is shown in FIG. 16 where the text (1601) including the tags (such as tag (1603)) is shown and a user can go to a particular unassigned pattern, review available patterns, and assign appropriate global control tags, or create new tags and use those, as appropriate.

Once all patterns have been assigned to a tag from the global control, the XML file is saved. Such a file (1701) is shown in FIG. 17 where the global tags indicate various things (e.g. the tag <warnpage> (1703) indicating a warning page). Once the XML file has been created, the final browser version of the file can be generated. FIG. 18 provides for a conversion module for such a system whereby a particular type of document format may be entered into a document format box (1801). There is also provided the original file name in a file name box (1803), and an indication of the global control file to be used (1805).

Figure 19A:
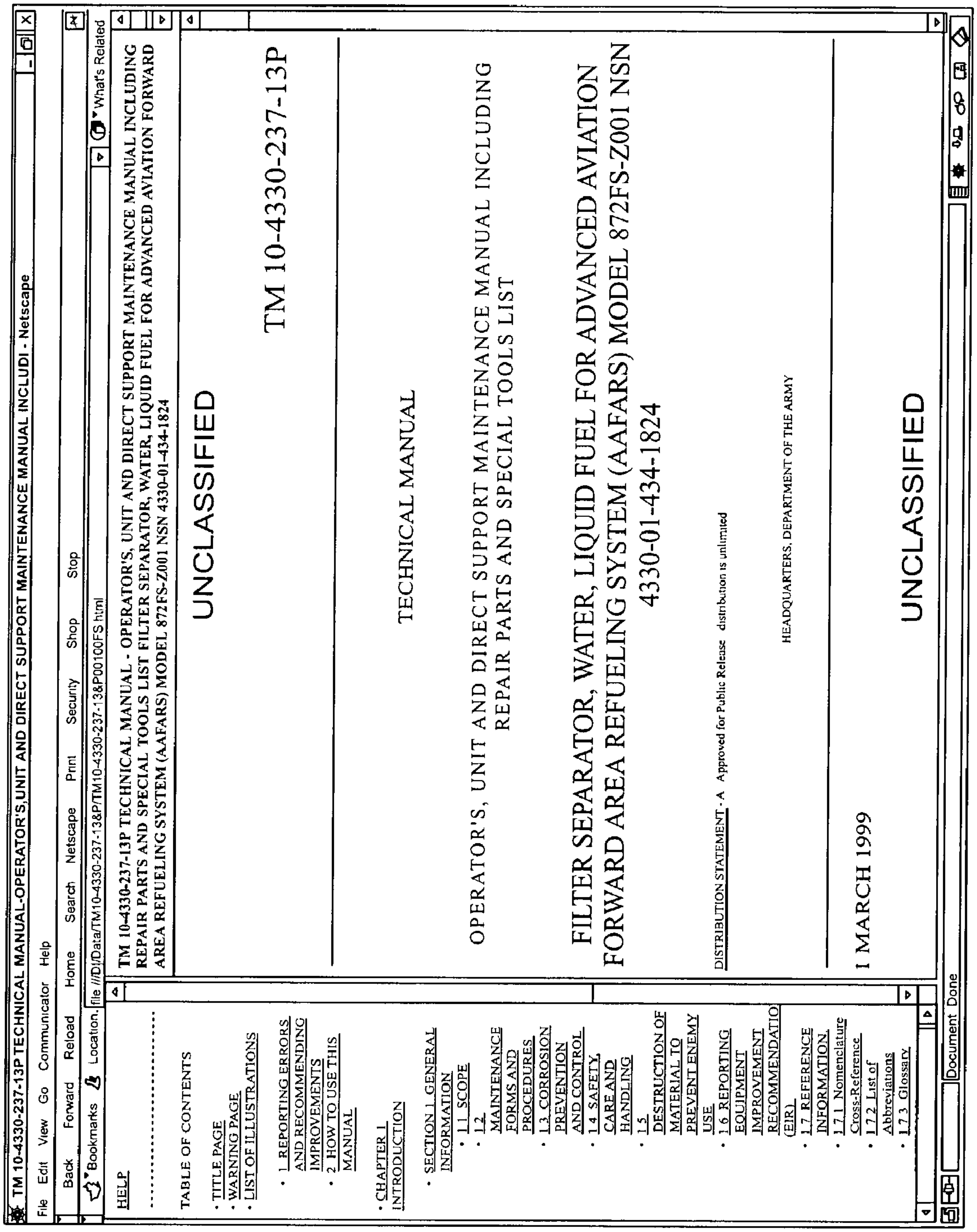
FIG. 19A shows an embodiment of a computer screen display of an interactive manual from the second embodiment of conversion software utilizing HTML only.

When the document is converted it may be converted into an HTML shell, which utilizes XML and an associated XSL style sheet to provide for the global parameters. Or it can alternatively be turned into straight HTML creating a resulting file similar to that created by the first embodiment. The frame situation is generally preferred, as it maintains more flexibility in the resulting files for later editing or inclusion of additional interactive reference materials interlinked therewith and shifts much of the formatting to the client. From a user's point of view, the two methods will produce screens which are essentially identical. A technical manual (this time without a linked figure showing) are shown in FIGS. 19A and 19B, 19A is the document using HTML from the original XML source while 19B is the HTML frame, XML, XSL document. As can be seen, they are virtually identical.

Regardless of which embodiment of the system and/or method is used to create the interactive reference system. The interactive reference system can comprise more than just interactive reference materials. In particular, the reference system, particularly when utilizing client/server network functionality, can provide additional services of the type available on a computer network and can comprise specialized services particularly related to tasks which are likely to be useful for those that are utilizing the reference materials.

One such service relates to the ordering of parts. As shown in the above embodiments, many of the reference materials that will be included in the interactive reference system are maintenance or repair manuals and therefore the user will likely be attempting to repair or maintain the device and these actions often require the acquisition of new parts. In particular, the user may have used FIG. 12 to remove the AC circuit and discovered in the process that bracket "9" (1101) is broken and needs to be replaced. Therefore the user needs to order a replacement bracket "9" (1101). As discussed above, the user can already obtain the part number for bracket "9" (1101) and information needed to order bracket "9" (1101) from the interactive parts list. However, particularly in the military, simply knowing which part to order does not necessarily complete the process. There is generally a significant amount of paperwork that needs to be completed and various tasks have to be completed to successfully order the part. An embodiment of a requisitioning service therefore includes interlinking to an embodiment of a parts requisitioning system. This embodiment is shown in FIGS. 20-22 and may be created for the exclusive use of users of the interactive reference materials.

The requisitioning system is designed in accordance with the basic tenets of an on-line storefront in an embodiment. However, the requisitioning system may include specific functionality to obtain information from interactive reference materials and may include functionality to operate in conjunction with military ordering requirements and legacy systems. In particular, when the requisitioning button (953) is selected, that button is associated with various disclosure and reference text. In particular, it is still associated with the index number of the selected part and the row (951). Using the interlinking of the other documents, information that will be needed to requisition the part is available from a logical chain from this reference text. Further, even the documents needed to order the part can be determined from information about the part.

Figure 20:
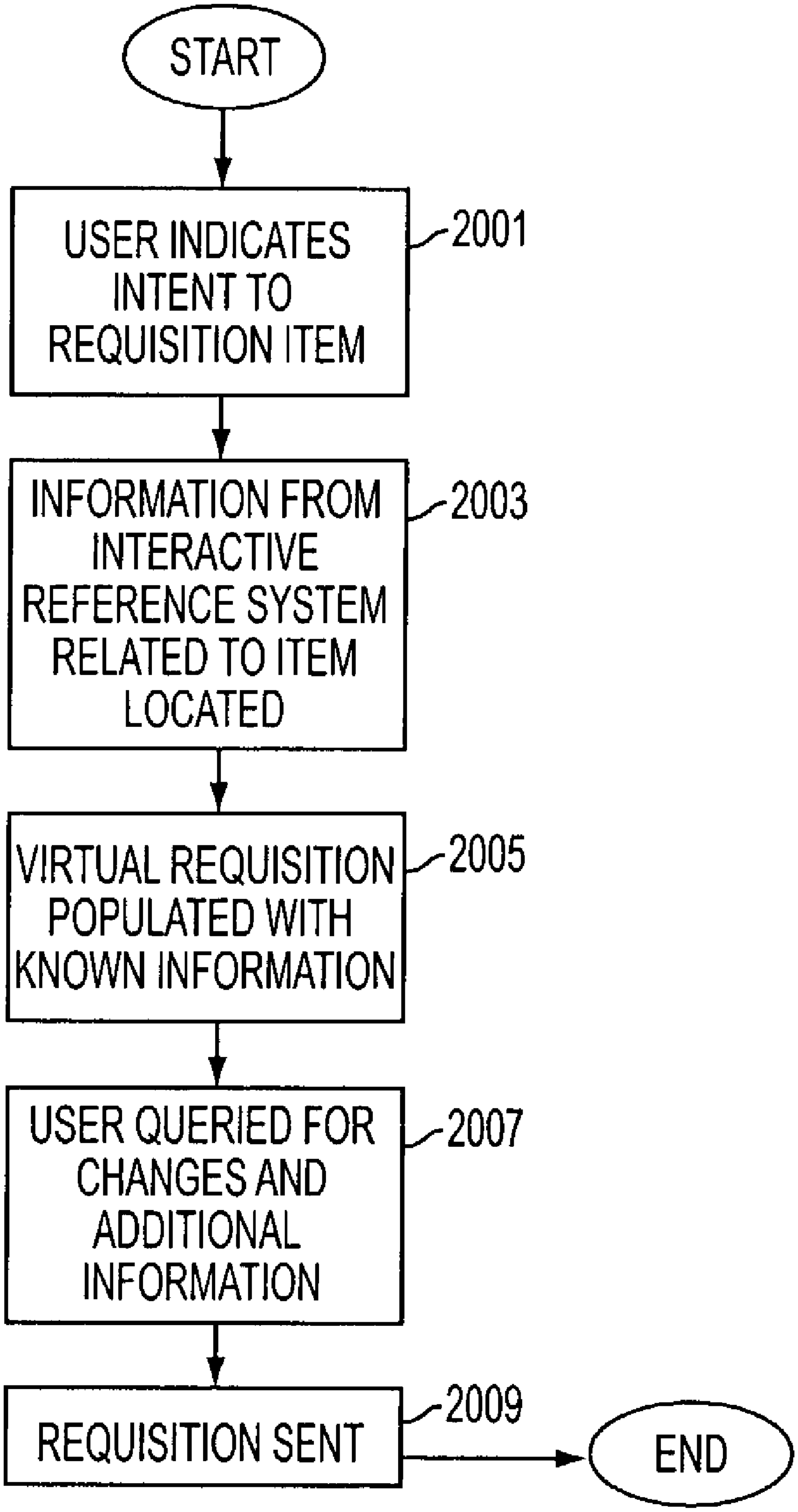
FIG. 20 provides a flow chart of the operation of an embodiment of a requisitioning system.

An embodiment of the requisitioning procedure is discussed in flowchart in FIG. 20 to show generally how the system works. In step (2001), the user indicates that they wish to requisition an item (such as, but not limited to, a part, a paper manual, or anything else associated with the device they are working with). In step (2003), the system determines based on links associated with the particular item what information is known in the interactive reference system that is required for ordering that item. This will generally be a series of parameters that provide for both an indication of a requisition function to use and the types of information needed by the particular function. This information is then populated into an appropriate virtual requisition in step (2005). In step (2007) the user is provided the virtual requisition and queried for any changes or any information that is not available from the interactive reference system, and in step (2009) the virtual requisition may be sent as a requisition (either electronically or by hand) to the necessary supplier and/or government office in the appropriate manner.

Figure 21A:
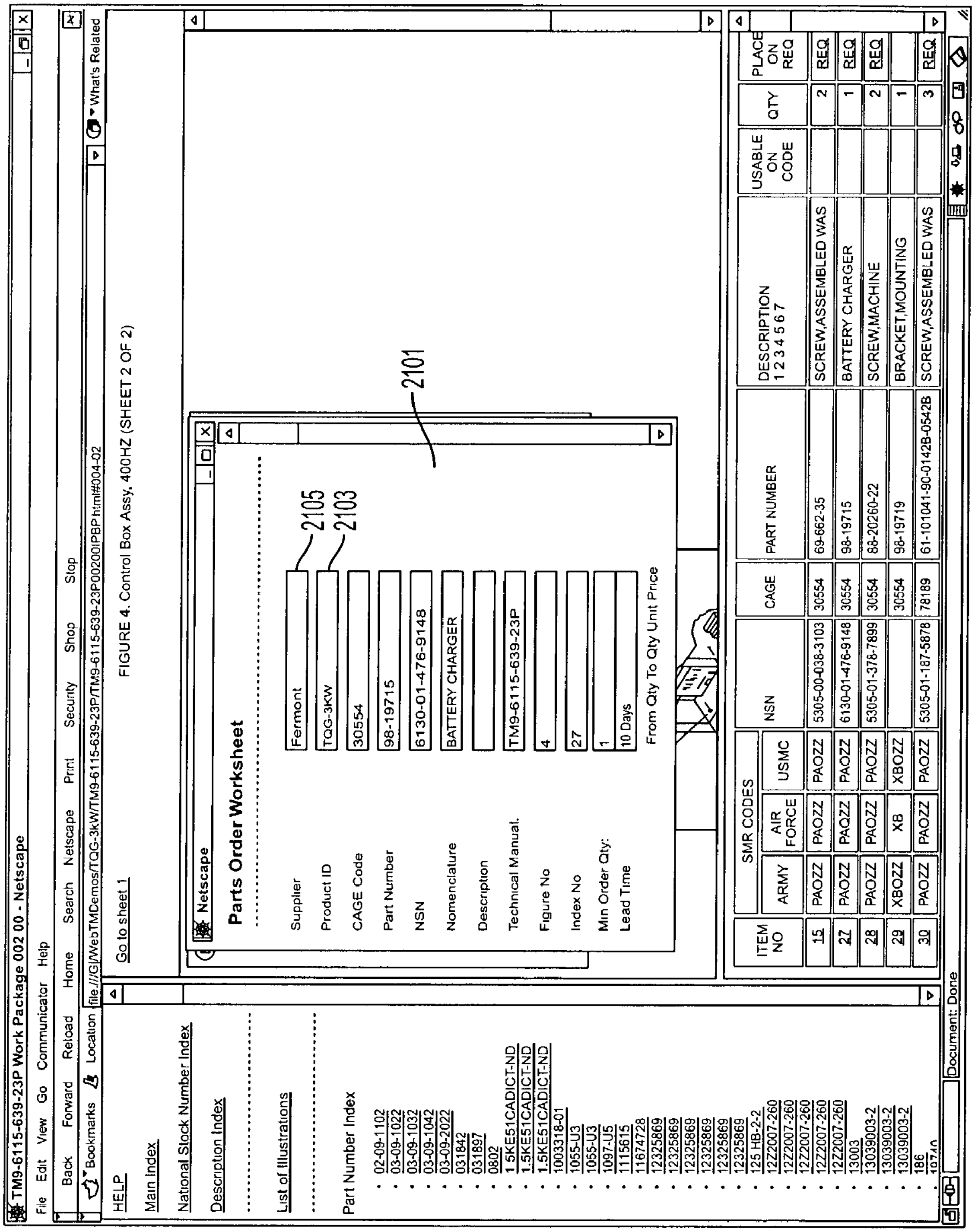
FIG. 21A shows an embodiment of a computer screen display of a virtual requisition form from the requisitioning system of FIG. 20.
Figure 21B:
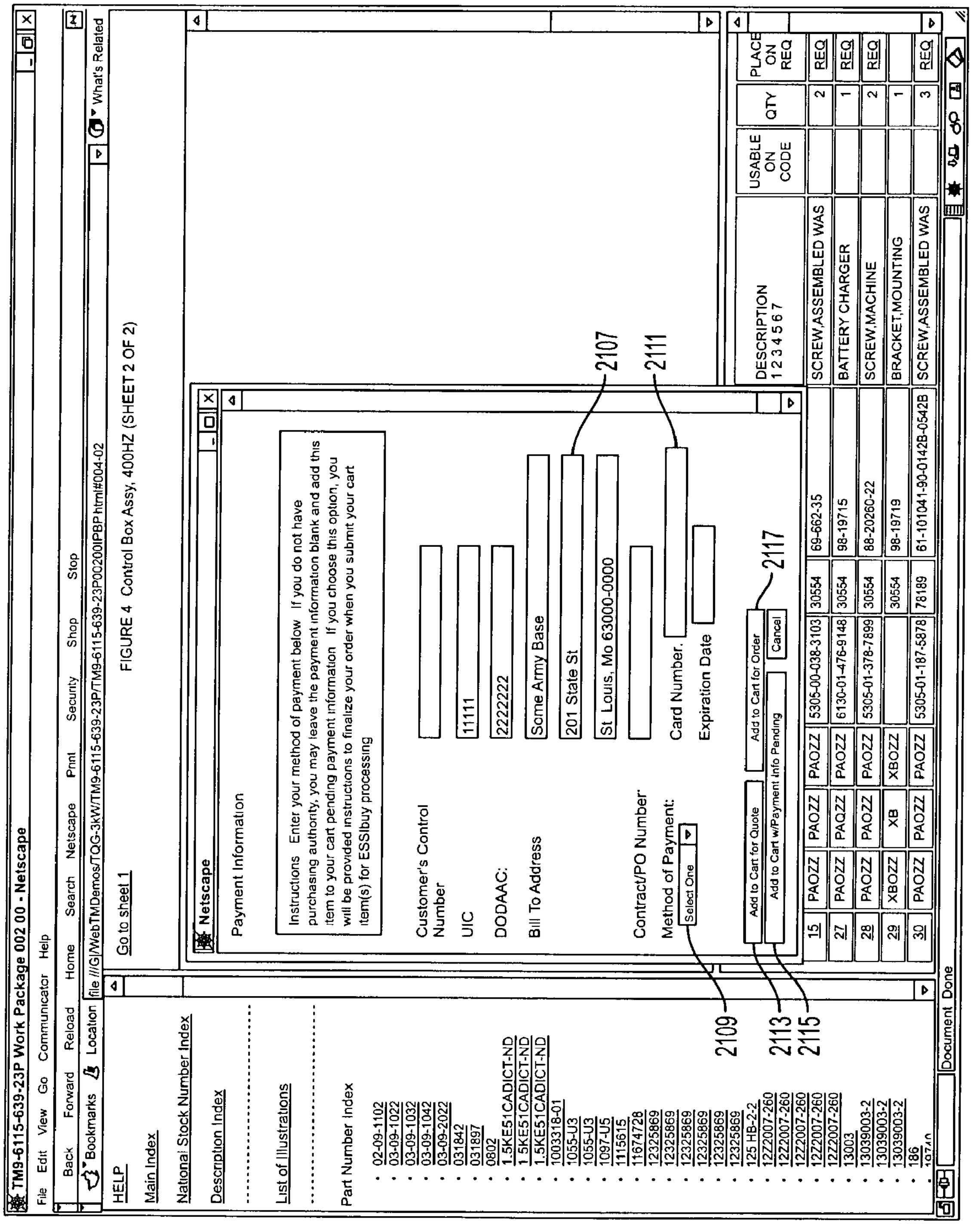
FIG. 21B shows a computer screen display of the virtual requisition form of FIG. 21A scrolled to show later text.
Figure 22:
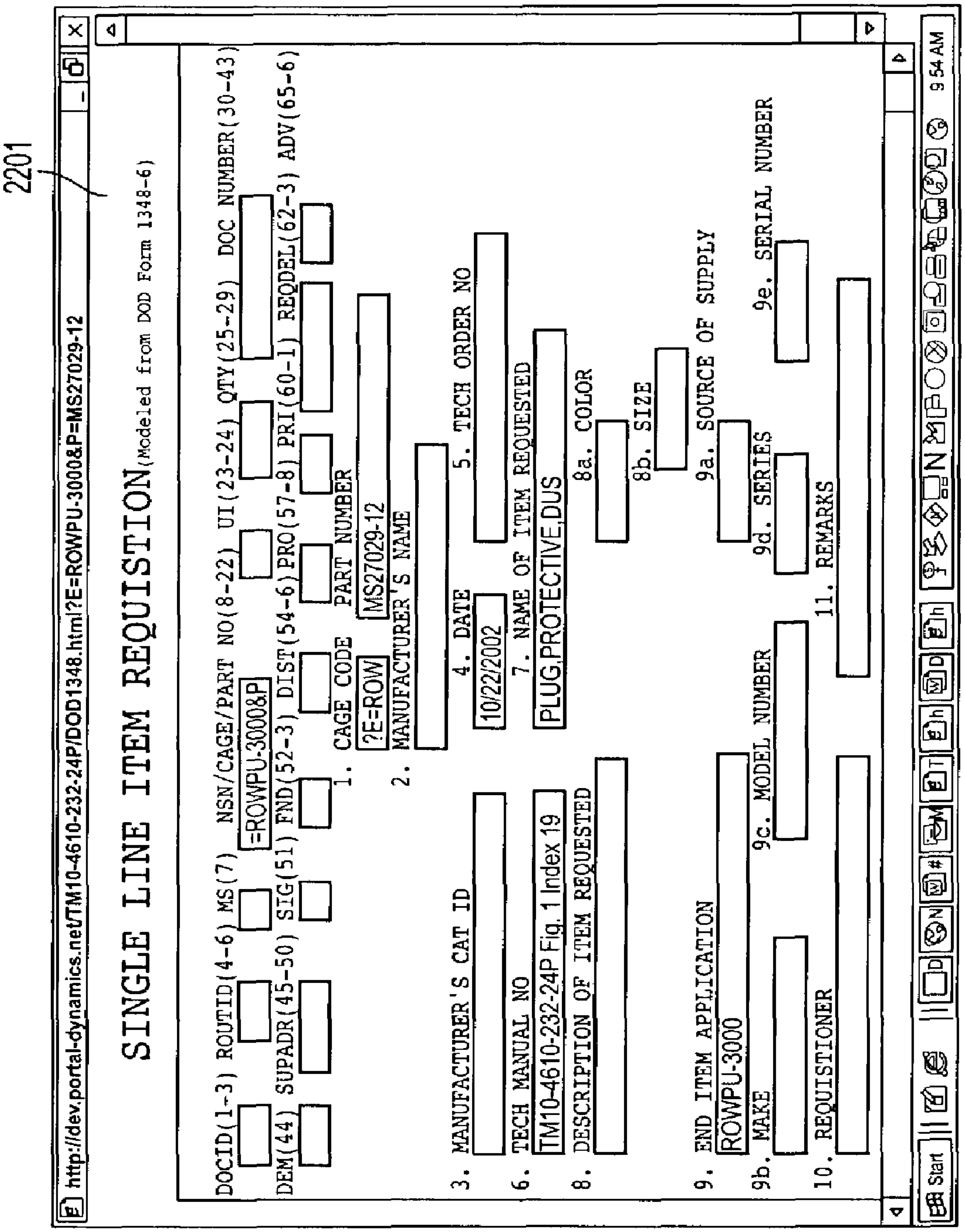
FIG. 22 shows a computer screen display of a government requisition form from the requisitioning system of FIG. 20.

These steps are best described by showing a user carrying out such steps in the screenshots of FIGS. 10 and 21-22. The user begins the process by requesting the item (in this case, a part) requisition in FIG. 10 by pressing the requisition link (953). Once this button has been pressed a new order form window (2101) is opened as is shown in FIG. 21A. This new window has been populated with information about the part from the virtual library such as the product ID in field (2103). This can also include information such as the part's manufacturer (2105). If one scrolls down this window, there is provided yet more information as shown in FIG. 21B. At the bottom of the virtual requisition, there is visible some information which is needed from the user. This includes such items as the billing information (2107) which is currently set to a default choice. There is also a menu for selecting a method of payment (2109) and providing verification of the number or identifier associated with that method (2111). Once this information has been entered, the part order can be submitted in the manner of a standard electronic shopping cart by clicking one of the three cart buttons (2113), (2115), or (2117) depending on what information has been entered and the user desires to enter. The selections available to a user for any part may have been selected by the manufacturer (2105) of the part from FIG. 21A. In particular, that part's manufacturer may be able to receive orders at a predetermined price directly from the user needing the part. In this case, the transaction can occur from here on out using systems known to those of ordinary skill in the art for performing e-commerce. Alternatively, the particular manufacturer (or another party, such as, but not limited to the government) may require additional procedures for the part to be ordered. For instance, the part may be stored by the military in a particular location and is not ordered from the manufacturer directly when needed, or the manufacturer may need to quote a price at the time of ordering. Further, the system may also be able to distinguish between a peace time or wartime requisition and may provide different types of ordering depending on which system is currently in effect. The requisitioning system can therefore include functionality to provide for more efficient requisitioning.

In the virtual requisition form or elsewhere in the requisition service there may be a button to link to a Government requisition form. This button allows the user to load into a window a representation of the particular government requisitioning form for the part (or parts) to be requested. Clicking this button will take the user to a screen such as that in FIG. 22 which now displays an electronic (and interactive in an embodiment) representation of the appropriate requisition form (2201) to obtain this part. This form has already been populated with known information and the user can fill out the remaining information and print out the form for submission if such a manner of ordering is desired. Alternatively, because the requisition form can be based on, or can be, an existing government requisition form, the form may be sent electronically as a requisition. This type of requisition, in an embodiment, is compatible with Army management systems and other pre-existing legacy systems currently used for requisition. In this case, the interactive reference system provides capability where the soldier can order a part using the appropriate system for ordering that part (or indeed have different alternatives for ordering) even if they do not know which system is appropriate to use. The interactive reference system can determine, based on information contained therein, which system to use for which part.

Alternatively quotes, requests for proposals (RFPs), or other types of interactive ordering systems or methods used by the military could be used to obtain particular parts if required based on the particular situation. The selection of what is to be used could be performed based on many factors known to the network, the client, or any other component and updated for the instant transaction. One of ordinary skill in the art would understand that the electronic requisitioning system shown in FIGS. 21 through 22 is merely one embodiment of how a requisitioning system could be performed, and the shopping cart and ordering forms shown herein could be modified to incorporate components of known electronic commerce sites to allow for sales to be accomplished in accordance therewith.

In conjunction with the above, the system provides for easy updating of parts lists and other reference materials. Because the reference materials are preferably stored on a limited number of servers, when it is necessary to update them, the new materials can be run through a conversion process as discussed above, and then the new updated file can replace the old file, be re-interlinked, and be made quickly available to any user needing that document without the need for distributing paper updates. Even if the system is stored on storage media, an electronic updating service can be used via a network, or new storage media can be distributed.

Further, one of ordinary skill in the art would recognize that a parts requisitioning system is merely one of many systems which could be associated with the interactive reference materials and in fact many useful online services could be so associated. In particular, streaming video or real-time services could be linked to the interactive library, as could help lines or customer service connections. In still another embodiment, the interactive library could include mapping or other location functions to help with product delivery or location.

In still another embodiment, the interactive materials could be linked with a diagnostic system either used by the user or on-board the device. The diagnostic system could evaluate the device for a malfunction and transfer its result to the server and/or client. The client can then obtain the reference material for fixing the detected problem and, in an embodiment, automatically requisition needed parts. In a still further embodiment, the communication with the device could be bi-directional. That is, the reference system, once loaded, can interact with the diagnostic. For instance, a user could indicate in the manual that they have completed a particular step, at which time the diagnostic runs a new series of tests to determine if the problem is fixed, or, if not, what actions should be taken next updating the interactive reference materials provided to the user so they can perform the next task.

While the invention has been disclosed in connection with certain preferred embodiments, this should not be taken as a limitation to all of the provided details. Modifications and variations of the described embodiments may be made without departing from the spirit and scope of the invention, and other embodiments should be understood to be encompassed in the present disclosure as would be understood by those of ordinary skill in the art.

The invention claimed is:

1. A method for converting paper reference materials into interactive reference materials comprising:

providing a computer;

providing a global control which indicates parameters specific to a reference document;

obtaining at least one reference document in a computer readable form by scanning paper reference materials and performing text recognition to create a raw text file forming said at least one reference document;

said computer inserting formatting tags into said reference document based on said global control;

said computer searching, based on said parameters in said global control, said at least one reference document for a first piece of reference text, said first piece of reference text being in a first location in said at least one reference document, having a first value, and referring a human reader to a second location separate from said first location but not linking to said second location;

said computer tagging said first piece of reference text with a tag indicating a reference text type and said first value;

said computer searching, based on said parameters in said global control, said at least one reference document for a second piece of reference text, said second piece of reference text being in said second location in said at least one reference document, and having said first value;

said computer tagging said second piece of reference text with a tag indicating a reference text type and said first value;

said computer linking said first piece of reference text with said second piece of reference text based on said first value and said global control; and said computer converting said at least one reference document into an interactive reference document by converting said first piece of reference text into a hyperlink so that when a user utilizes said hyperlink, said user is taken to said second location.

2. The method of claim 1 wherein said reference document comprises a file in extensible markup language (XML).

3. The method of claim 1 wherein the step of obtaining further comprises converting ASCII text into extensible markup language (XML) to create said reference document.

4. The method of claim 1 wherein at least one of the steps of searching and at least one of the steps of tagging includes hot-spotting.

5. The method of claim 1 wherein said tags comprise XML tags.

6. The method of claim 1 wherein said global control comprises a database.

7. The method of claim 6 wherein said database comprises a Document Type Definition (DTD).

8. The method of claim 7 wherein said DTD is selected from the group consisting of: Army 2361A, Air Force 38784, and Navy 3001.

9. The method of claim 1 wherein said step of converting comprises converting said reference documents into HTML.

10. The method of claim 1 wherein said step of converting comprises converting said reference documents into an HTML frame, XML, and an XSL style sheet.

11. The method of claim 1 wherein a human assists said computer in searching and tagging.

12. The method of claim 1 wherein said paper reference materials comprise a military document.

13. The method of claim 12 wherein said military document is selected from the group consisting of: a maintenance manual, a repair manual, an operator's manual, an Integrated Parts List (IPB), or a Repair Parts Special Tools List (RPSTL).

14. The method of claim 1 wherein said interactive reference document is accessed from a server via a network.

15. The method of claim 1 wherein said interactive reference document is accessed from local storage media.

16. A computer readable medium having computer readable program code embodied therein, the code instructing the computer to:

obtain at least one reference document in a computer readable form by scanning paper materials and performing text recognition to forma a raw text file;

access a global control which indicates parameters specific to said reference document;

insert formatting tags into said reference document based on said global control;

search said at least one reference document, based on said parameters in said global control, for a first piece of reference text, said first piece of reference text being in a first location in said at least one reference document, having a first value, and referring a human reader to a second location separate from said first location, but not linking to said second location;

tag said first piece of reference text with a tag indicating a reference text type and said first value;

search said at least one reference document, based on said parameters in said global control, for a second piece of reference text, said second piece of reference text being in said second location in said at least one reference document, having said first value, and referring a reader to another location separate from said second location;

tag said second piece of reference text with a tag indicating a reference text type and said first value;

link said first piece of reference text withsaid second piece of reference text based on said first value and said global control; and convert said at least one reference document into an interactive reference document by placing said reference document into a browser readable format, and said first piece of reference text into a hyperlink directed to said second location.

* * * * *